(12) United States Patent
Ueda et al.

(10) Patent No.: US 8,476,701 B2
(45) Date of Patent: Jul. 2, 2013

(54) SEMICONDUCTOR DEVICE WITH GATE ELECTRODE INCLUDING A CONCAVE PORTION

(75) Inventors: Takehiro Ueda, Kanagawa (JP); Hiroshi Kawaguchi, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/067,243

(22) Filed: May 18, 2011

(65) Prior Publication Data
US 2011/0284951 A1 Nov. 24, 2011

(30) Foreign Application Priority Data

May 19, 2010 (JP) .................................. 2010-115731
Mar. 31, 2011 (JP) .................................. 2011-079784

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC .... 257/330; 257/332; 257/334; 257/E21.419; 257/E21.428; 257/E21.429; 257/E21.43; 257/E27.091; 257/E29.26; 257/E21.655

(58) Field of Classification Search
USPC .......... 257/330, 332, 334, E21.419, E21.428, 257/E21.429, E21.43, E21.655, E27.091, 257/E29.26
See application file for complete search history.

(56) References Cited

U.S. PATENT DOCUMENTS

| | | | | |
|---|---|---|---|---|
| 4,763,177 A | * | 8/1988 | Paterson | 257/315 |
| 5,229,310 A | * | 7/1993 | Sivan | 438/156 |
| 5,298,781 A | * | 3/1994 | Cogan et al. | 257/333 |
| 5,336,904 A | * | 8/1994 | Kusunoki | 257/23 |
| 5,338,953 A | * | 8/1994 | Wake | 257/316 |
| 5,378,655 A | | 1/1995 | Hutchings et al. | 438/138 |
| 5,623,152 A | * | 4/1997 | Majumdar et al. | 257/330 |

(Continued)

FOREIGN PATENT DOCUMENTS

| | | |
|---|---|---|
| JP | 51-147269 A | 12/1976 |
| JP | 62-126675 A | 6/1987 |

(Continued)

OTHER PUBLICATIONS

S. Nomura, et al., "Technology for Forming Ultra-Thin Silicon Oxide Film and Interface Evaluation", pp. 28-29, Realize Science & Engineering Center Co., Ltd, published on Jan. 31, 1997).

*Primary Examiner* — Ida M Soward
(74) *Attorney, Agent, or Firm* — McGinn IP Law Group, PLLC

(57) ABSTRACT

A semiconductor device includes a transistor that has a trench formed in an element forming region of a substrate, a gate insulating film formed on side faces and a bottom face of the trench, a gate electrode formed on the gate insulating film so as to bury the trench, a source region formed on one side in the gate longitude direction, which is formed on the surface of the substrate, and a drain region formed on the other side in the gate longitude direction. Here, the gate electrode is formed so as to be exposed also on the substrate outside the trench, and the gate electrode is disposed so as to cover upper portions of both ends of the trench and so as to form at least one concave portion having a depth reaching the substrate in a center portion.

28 Claims, 31 Drawing Sheets

U.S. PATENT DOCUMENTS

| | | | |
|---|---|---|---|
| 5,736,753 A * | 4/1998 | Ohno et al. | 257/77 |
| 6,150,693 A * | 11/2000 | Wollesen | 257/330 |
| 6,452,231 B1 | 9/2002 | Nakagawa et al. | 257/343 |
| 6,949,785 B2 * | 9/2005 | Tu | 257/301 |
| 7,492,035 B2 | 2/2009 | Risaki | 257/611 |
| 7,518,185 B2 * | 4/2009 | Hadizad et al. | 257/330 |
| 7,572,703 B2 * | 8/2009 | Annese et al. | 438/270 |
| 7,709,324 B2 * | 5/2010 | Shiratake | 438/259 |
| 7,799,636 B2 * | 9/2010 | Herrick et al. | 438/259 |
| 7,888,734 B2 * | 2/2011 | Chu et al. | 257/343 |
| 8,129,780 B2 * | 3/2012 | Shinbori et al. | 257/334 |
| 8,133,785 B2 * | 3/2012 | Kaneko | 438/270 |
| 8,193,578 B2 * | 6/2012 | Shirai et al. | 257/330 |
| 2005/0236664 A1 * | 10/2005 | Aoki et al. | 257/330 |
| 2007/0045724 A1 * | 3/2007 | Lim et al. | 257/330 |
| 2007/0069255 A1 | 3/2007 | Kim | 257/288 |
| 2007/0096204 A1 * | 5/2007 | Shiratake | 257/330 |
| 2009/0026538 A1 * | 1/2009 | Hashitani | 257/330 |
| 2009/0117700 A1 * | 5/2009 | Lin et al. | 438/270 |
| 2010/0059816 A1 | 3/2010 | Shimada et al. | 257/334 |
| 2010/0109055 A1 | 5/2010 | Kim | 257/255 |

FOREIGN PATENT DOCUMENTS

| | | |
|---|---|---|
| JP | 6-350090 A | 12/1994 |
| JP | 10-32331 A | 2/1998 |
| JP | 11-103058 A | 4/1999 |
| JP | 2006-294645 A | 10/2006 |
| JP | 2007-81396 A | 3/2007 |
| JP | 2009-88188 A | 4/2009 |

* cited by examiner

SEMICONDUCTOR DEVICE WITH GATE ELECTRODE INCLUDING A CONCAVE PORTION

This application is based on Japanese patent applications No. 2010-115731 and No. 2011-079784, the content of which is incorporated hereinto by reference.

BACKGROUND

1. Technical Field

The present invention relates to a semiconductor device and a method of manufacturing the semiconductor device.

2. Related Art

In order to broaden the substantial channel width of a transistor without increasing the dimension thereof, there is known a technology of forming concaves and convexes such as trenches in a channel region on a substrate.

For example, Japanese Laid-Open patent publication NOs. H11-103058 and S51-147269 disclose a semiconductor device including a trench gate type transistor in which a trench is formed on the surface of a substrate.

Japanese Laid-Open patent publication NO. 2006-294645 discloses a semiconductor device having: a well region; a plurality of trenches that extend from a surface to a intermediate depth of the well region; a gate insulating film that is disposed on the surface of a concave-convex portion in which the trenches are formed; a gate electrode that is buried inside the trench; and a gate electrode film that is brought into contact with the gate electrode buried inside the trench in the concave-convex region except for areas near both ends of the trench and is disposed on the surface of a substrate; and source and drain regions that are two second conductive-type semiconductor layers having low resistance and are disposed at positions shallower than the depth of the well region, in the well region except for the portion under the gate electrode. Accordingly, since areas near both ends of the trench become the source and drain regions, the contact area between the source and drain regions and the channel region are to be relatively large, whereby the on-resistance can be lowered.

In addition, Japanese Laid-Open patent publication NO. S62-126675 discloses a configuration that is similar to that disclosed in Japanese Laid-Open patent publication NO. 2006-294645.

Meanwhile, although different from the lateral transistors disclosed in Japanese Laid-Open patent publication NOs. H11-103058, S51-147269, 2006-294645, and S62-126675, there is also known a vertical MOS transistor in which the current path is in the vertical direction. Japanese Laid-Open patent publication NO. H6-350090 discloses an insulating-gate field effect device in which a gate conduction material is formed only inside the trench.

Also Japanese Laid-Open patent publication NO. H10-32331 discloses the configuration of a vertical MOS transistor. Here, in the vertical MOS transistor, parasitic capacitance formed by n electric-field relaxing regions and a gate electrode with a gate oxide film interposed therebetween is higher than that of the lateral MOS transistor at the ratio of the chip area, and accordingly, the feedback capacity increases. Therefore, there is a problem in that the switching loss increases. Thus, Japanese Laid-Open patent publication NO. H10-32331 discloses a configuration in which only the film thickness of the gate insulating film in the bottom portion of the trench is formed thick. Accordingly, the switching loss can be reduced by decreasing the parasitic capacitance formed by the n electric-field relaxing regions and the gate electrode while the threshold value of the vertical MOS transistor is maintained to be low.

Also in Japanese Laid-Open patent publication NO. 2009-88188, the configuration of a vertical MOS transistor is disclosed. In the same document, a configuration is disclosed in which, in connection with the trench that is formed in the n-type semiconductor layer, a silicon oxide film having a uniform thickness and being rounded at the corner portion is formed on the bottom portion of trench and the vicinity thereof. On the other hand, on the upper sides of the side faces of the trench, a silicon oxide film that is thinner than the silicon oxide film formed in the bottom portion and the vicinity thereof and is rounded in the corners is formed. The capacitance of the gate decreases due to the thick silicon oxide film, superior characteristics of the transistor are secured through a thin silicon oxide film on the upper portion. In addition, owing to the roundness of the corner portion, a defect in the crystal does not nearly occur, and the electric field of the gate is distributed, whereby the gate breakdown voltage improves.

Japanese Laid-Open patent publication NO. 2007-81396 discloses a MOS transistor including a semiconductor substrate having a principal surface of a (100) face. In addition, a source region and a drain region are disposed on a straight line parallel to the <100> direction.

SUMMARY

However, according to the configurations of Japanese Laid-Open patent publication NOs. H11-103058 and S51-147269, there are problems as follows.

In a channel region disposed in the upper end portions of the trench, particularly, in curved portions near the trench, an electric field that has to be uniformly applied from the gate electrode is high due to the concentration of the electric field, and thus there is a problem in that the transistor is likely to operate at a threshold voltage that is lower than those of other portions (a parasitic transistor may easily operates). Accordingly, there is a drawback that the transistor starts to operate at the threshold voltage that is lower than the designed voltage.

In addition, although impurities used for controlling the threshold value are implanted into the channel region, the impurities may be easily rediffused into the gate insulating film during a heat treatment process performed in the course of manufacturing. Particularly, since the gate insulating film is present on the lateral side of the side faces of the trench and on the top surface of the substrate, there is a problem in that the impurity density may easily decrease. Accordingly, for such a reason, there is a drawback that the transistor starts to operate at a threshold voltage that is lower than the designed voltage.

Therefore, conventionally, as illustrated in FIG. 17, an area in which the threshold voltage is partially low is formed, and thus a configuration is formed therein in which a normal transistor (a normal Vt transistor) having a normal threshold voltage as designed and a transistor (a low Vt transistor) having a threshold voltage lower than the designed value are connected in parallel. Accordingly, there is a problem in that hump occurs.

In one embodiment, there is provided a semiconductor device comprising a substrate that includes an element forming region that is partitioned by an element isolation insulating film; and a transistor that has a trench formed in the element forming region of the substrate, a gate insulating film formed on side faces and a bottom face of the trench, a gate electrode formed on the gate insulating film so as to bury the trench, a source region formed on one side of the gate electrode, which is disposed on a surface of said substrate, in a gate longitude direction, and a drain region formed on the other side of the gate electrode in the gate longitude direction. The gate electrode is formed so as to be exposed also on the substrate outside the trench, and the gate electrode formed so as to be exposed is disposed so as to cover upper portions of both ends of the trench in the gate longitude direction and so as to form an uncovered region in a center portion.

In another embodiment, there is provided a method of manufacturing a semiconductor device including a transistor. The method includes: forming a channel region by implanting impurity ions of a second conductive type into an element forming region that is formed on one side of a substrate and is partitioned by an element isolation insulating film; forming a trench in the channel region formed on the one side of the substrate; covering side faces and a bottom face of the trench with a gate insulating film by forming the gate insulating film on the one side of the substrate; forming a gate electrode so as to bury an inside of the trench; patterning the gate electrode in a predetermined shape; and forming a source region and a drain region by implanting impurity ions of a first conductive type on both sides of the channel region formed on the one side of the substrate in a gate longitude direction. In the patterning of the gate electrode in a predetermined shape, the gate electrode is formed so as to be exposed also on the substrate outside the trench, and the gate electrode formed so as to be exposed is disposed so as to cover upper portions of both ends of the trench in the gate longitude direction and is patterned so as to form an uncovered region in a center portion.

In another embodiment of the invention, there is provided a semiconductor device comprising: a substrate that includes an element forming region that is partitioned by an element isolation insulating film; and a transistor that has a trench formed in the element forming region of the substrate, a gate insulating film formed on side faces and a bottom face of the trench, a gate electrode formed on the gate insulating film so as to bury the trench, a source region formed on one side of the gate electrode, which is disposed on a surface of the substrate, in a gate longitude direction, and a drain region formed on the other side of the gate electrode in the gate longitude direction. The gate electrode is formed so as to be exposed also on the substrate outside the trench, the gate electrode formed so as to be exposed is disposed so as to cover upper portions of both ends of the trench in the gate longitude direction and so as to form at least one concave portion having a depth reaching the substrate in a center portion, and a film thickness of the gate insulating film formed in lower portions from a predetermined height of the side faces of the trench is thicker than a film thickness of the gate insulating film formed along the upper portions from the predetermined height of the side faces of the trench and is equal to or more than a film thickness of the gate insulating film on the bottom face.

In another embodiment of the invention, there is provided a method of manufacturing a semiconductor device including a transistor. The method comprises: forming a channel region by implanting impurity ions of a second conductive type into an element forming region that is formed on one side of a substrate and is partitioned by an element isolation insulating film; forming a trench in the channel region formed on the one side of the substrate; covering side faces and a bottom face of the trench with a gate insulating film by forming the gate insulating film on the one side of the substrate; forming a gate electrode so as to bury an inside of the trench; patterning the gate electrode in a predetermined shape; and forming a source region and a drain region by implanting impurity ions of a first conductive type on both sides of the channel region formed on the one side of the substrate in a gate longitude direction. In the covering with the gate insulting film, a film thickness of the gate insulating film formed in lower portions from a predetermined height of side faces of the trench is formed to be thicker than a film thickness of the gate insulating film formed along the upper portions from the predetermined height of the side faces of the trench and to be equal to or more than a film thickness of the gate insulating film on the bottom face. In addition, in the patterning of the gate electrode in a predetermined shape, the gate electrode is formed so as to be exposed also on the substrate outside the trench, and the gate electrode formed so as to be exposed is disposed so as to cover upper portions of both ends of the trench in the gate longitude direction and is patterned so as to form at least one concave portion having a depth reaching the substrate in a center portion.

According to this configuration, an area in which the gate electrode is not formed is arranged on the channel region of the transistor. Accordingly, in a place at which the gate electrode is not disposed, the operation of a parasitic transistor starting to operate at a threshold voltage lower than the designed voltage can be effectively suppressed. Accordingly, as will be described with reference to FIGS. 13 and 16, transistors operating at the designed threshold voltage are connected in series as a whole, and the operation of the parasitic transistor starting to operate at a threshold voltage lower than the designed voltage may be suppressed, whereby the occurrence of hump may be prevented.

Furthermore, an arbitrary combination of the above-described constituent elements, and a thing acquired by converting the representation of a method, a device, and the like of the invention are effective as embodiments of the present invention.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1A:
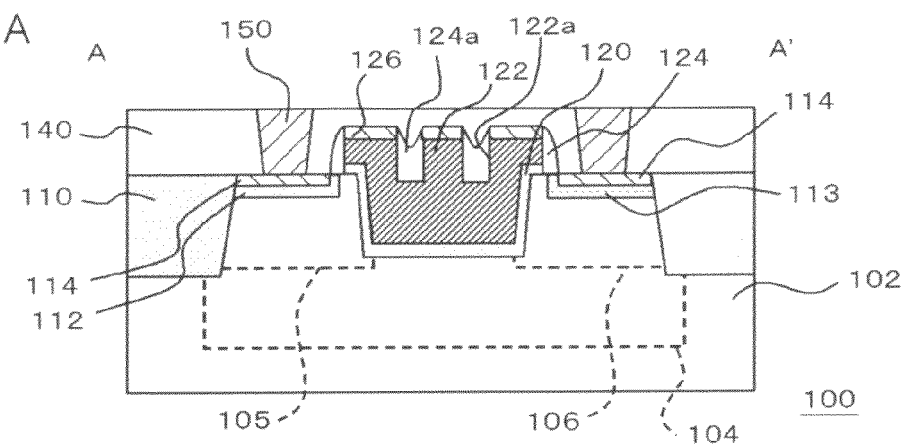
FIGS. 1A and 1B are cross-sectional views illustrating an example of the configuration of a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the present invention will be described with reference to the drawings. In all the drawings, the same reference numeral is assigned to the same constituent elements, and the description thereof is not repeated.

(First Embodiment)

FIGS. 1A, 1B, 2A, and 2B are cross-sectional views illustrating an example of the configuration of a semiconductor device according to the embodiment of the present invention.

Figure 3:
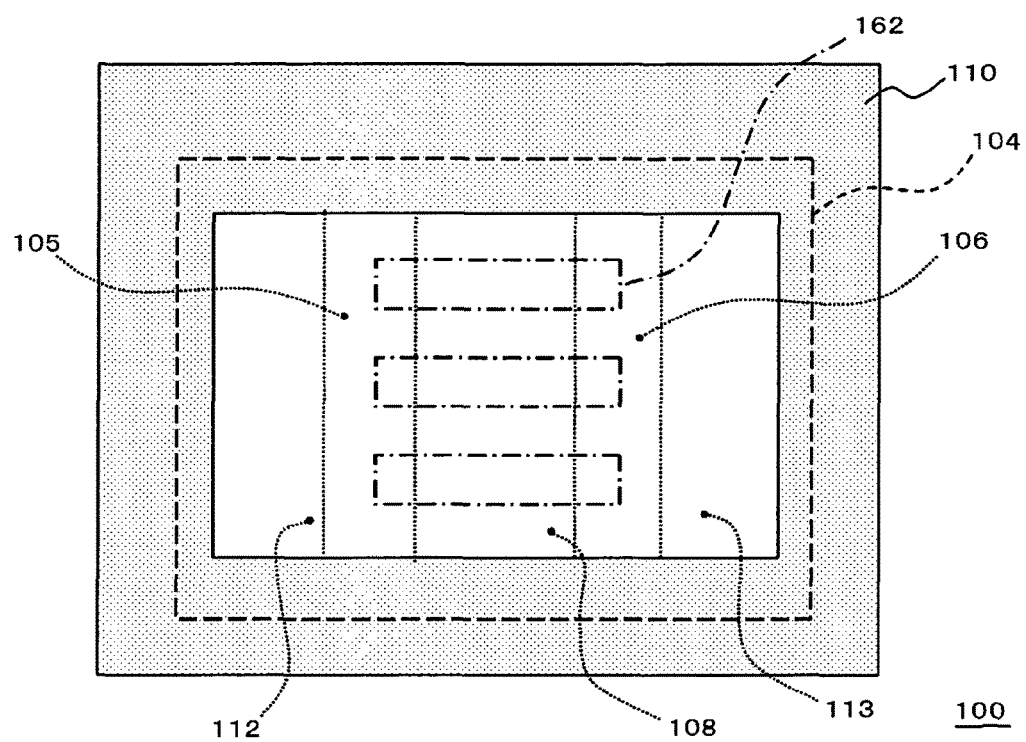
FIG. 3 is a plan view illustrating an example of the configuration of a semiconductor device according to an embodiment of the present invention.
Figure 4A:
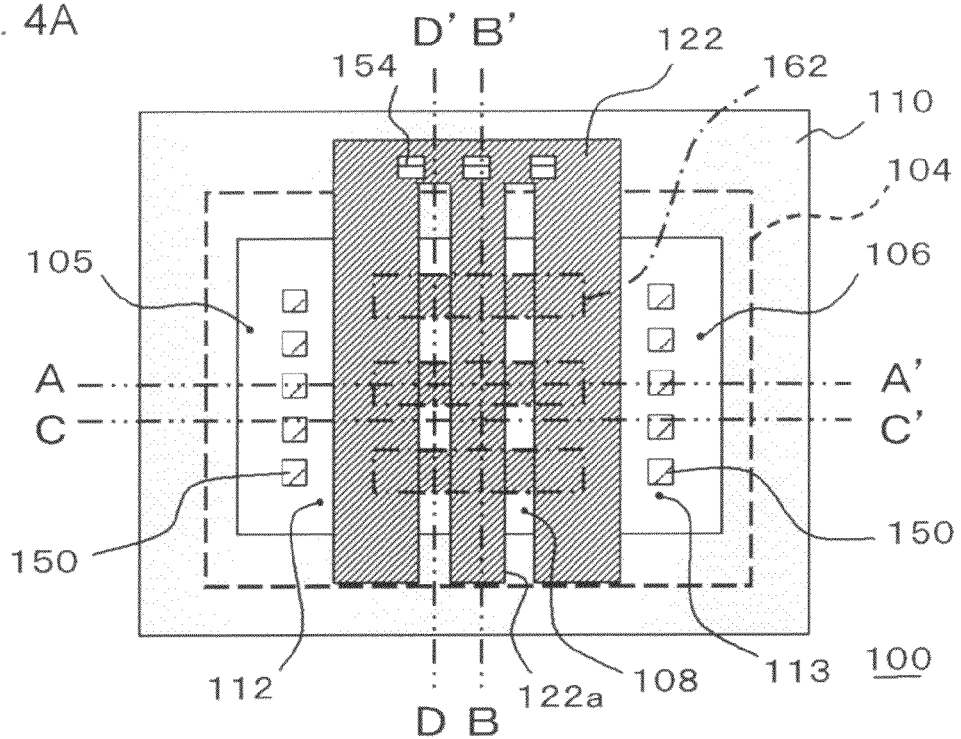
FIGS. 4A and 4B are plan views illustrating an example of the configuration of a semiconductor device according to an embodiment of the present invention.
Figure 4B:
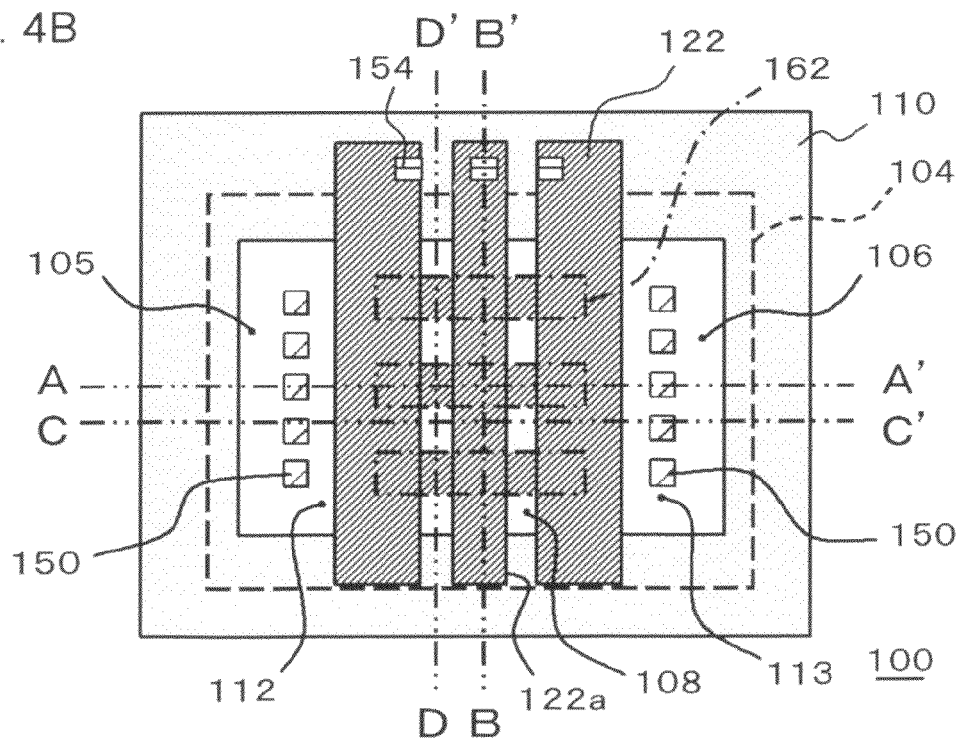

FIGS. 3, 4A, and 4B are plan views illustrating an example of the configuration of a semiconductor device according to the embodiment of the present invention.

Figure 1B:
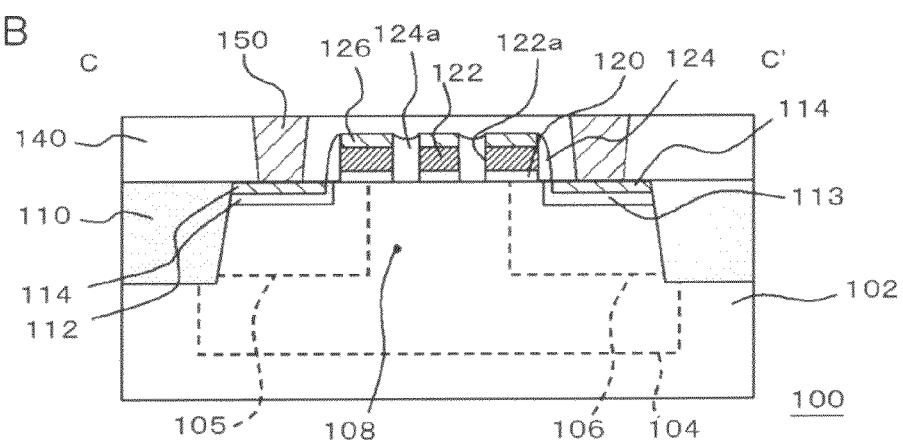
Figure 2A:
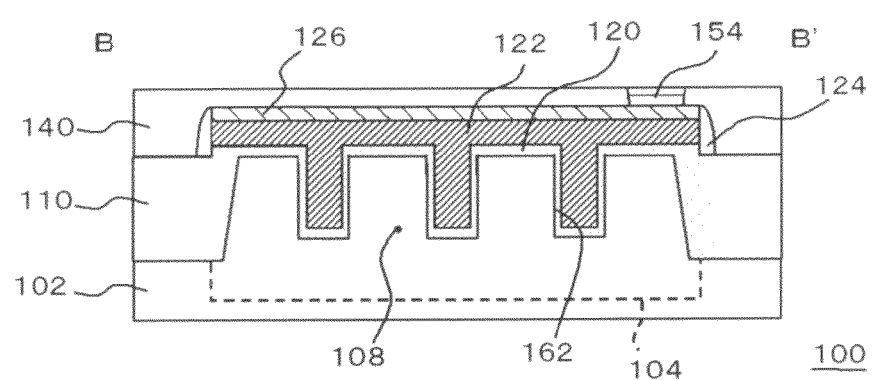
FIGS. 2A and 2B are cross-sectional views illustrating an example of the configuration of a semiconductor device according to an embodiment of the present invention.
Figure 2B:
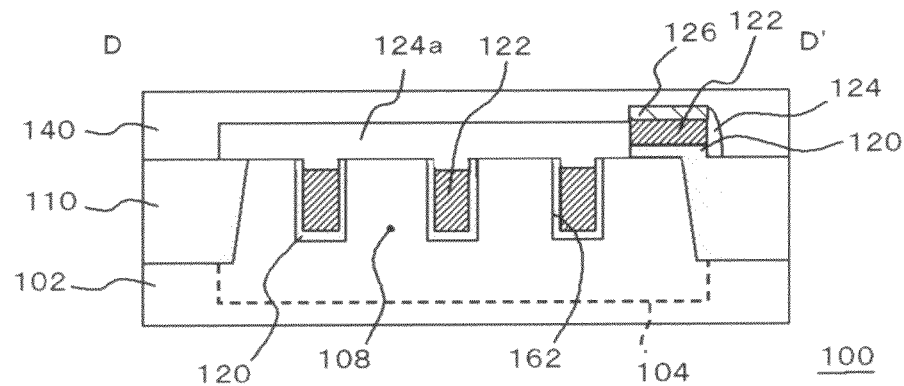

FIG. 1A is a cross-sectional view taken along line A-A' shown in FIG. 4A, and FIG. 1B is a cross-sectional view taken along line C-C' shown in FIG. 4A. FIG. 2A is a cross-sectional view taken along line B-B' shown in FIG. 4A, and FIG. 2B is a cross-sectional view taken along line D-D' shown in FIG. 4A. For easy understanding of the configuration, in FIG. 3, a gate electrode 122 is not shown, and each region is denoted only by lines.

Hereinafter, a first conductive type refers to n-type, and a second conductive type refers to p-type as an example. However, the conductive types may be reversed. In addition, the gate electrode 122 may be connected in one end as illustrated in FIG. 4A, and thus a manufacturing process thereof may be omitted. Alternatively, as illustrated in FIG. 4B, the gate electrode 122 may be connected through an upper wiring in a state in which the end portions are separated. Such premises are the same in all the embodiments described below.

The semiconductor device 100 includes a substrate 102, and transistors formed on one side of the substrate 102. The substrate 102 may be configured by a semiconductor substrate such as a silicon substrate. The semiconductor device 100 includes an element isolation insulating film 110 formed on the substrate 102, an element forming region that is partitioned by the element isolation insulating film 110, and transistors formed in the element forming region.

In the element forming region on one surface of the substrate 102, there are formed a well 104 that is a p-type (the second conductive type) impurity diffusion region, a source region 112 and a drain region 113 that are n-type (the first conductive type) impurity diffusion regions, and offset regions 105 and 106 of the n-type (the first conductive type) impurity diffusion regions disposed on the outer periphery of the source region 112 and the drain region 113.

The offset regions 105 and 106, the source region 112, and the drain region 113 are formed within the well 104. In the well 104, there is a p-type (the second conductive type) channel region 108 which is interposed between the source region 112 and the drain region 113 in the longitudinal direction of the gate and defined by the offset regions 105 and 106. In FIGS. 1A, 1B, 2A and 2B, for easy understanding of the configuration, the area of the well region 104 and the offset regions 105 and 106 is illustrated by lines (broken lines).

The semiconductor device 100 includes: in the channel region 108 on one surface of the substrate 102, a plurality of trenches 162 of which the depths in the widthwise direction of the gate intermittently change; a gate insulating film 120 that is formed on the side faces and the bottom face of each of the plurality of trenches 162; a gate electrode 122 formed on the gate insulating film 120 so as to bury the plurality of trenches 162; and side walls 124 that are formed on the side faces of the gate electrode 122.

According to this embodiment, in at least a partial area, the gate electrode 122 and the gate insulating film 120 are formed so as to be also exposed on the surface of the substrate 102 outside the trenches 162 arranged on the surface of the substrate 102. The gate insulating film 120 is also disposed between the substrate 102 and the gate electrode 122 on the surface of the substrate 102 outside the trenches 162.

Here, the gate electrode 122 is disposed so as to cover the upper portions of both ends of the trench 162 in the longitudinal direction of the gate and to form an uncovered area in the center portion. In other words, according to this embodiment, a concave portion 122a is arranged in the gate electrode 122. As illustrated in FIG. 1A, in a place at which the concave portion 122a is not formed, the gate insulating film 120 and the gate electrode 122 are formed so as to be exposed on the substrate 102 outside the trench 162 on the surface of the substrate 102. On the other hand, as illustrated in FIG. 1B, in a place at which the concave portion 122a is formed, the gate electrode 122 is formed only inside the trench 162 and is not formed on the substrate 102 outside the trench 162 on the surface of the substrate 102.

In this embodiment, the concave portion 122a can be configured so as to be disposed in an area not overlapping the source region 112 and the drain region 113. Alternatively, the concave portion 122a may be configured so as to be disposed on the channel region 108.

In addition, here, in the place at which the concave portion 122a is formed, the upper face of the gate electrode 122 is located at a position lower than that of the upper face (the surface of the substrate 102) of the trench 162. By employing such a configuration, in this area, the upper end portions of the trench 162 are prevented from being applied with a voltage from the gate electrode 122.

According to this embodiment, a silicide layer 114 is formed on the surfaces of the source region 112 and the drain region 113, and a silicide layer 126 is formed on the surface of the gate electrode 122 respectively. In addition, an interlayer insulating film 140 is formed on the substrate 102. In the interlayer insulating film 140, a contact 150 connected to the silicide layer 114 on the source region 112, a contact 150 connected to the silicide layer 114 on the drain region 113, and a contact 154 connected to the silicide layer 126 on the gate electrode 122 are formed.

The element isolation insulating film 110 is disposed so as to be lateral to the source region 112 and the drain region 113 in the longitudinal direction of the gate and is formed on both sides of the plurality of the trenches 162 in the widthwise direction of the gate. The element isolation insulating film 110 is formed around the area in which the transistor is formed, thereby demarcating and isolating the area in which the transistor is formed from other areas.

Mainly, the transistor is configured with the source region 112, the drain region 113, the offset regions 105 and 106, and the gate insulating film 120, the gate electrode 122, the channel region 108, and the plurality of the trenches 162 as main components.

Next, the manufacturing procedure of a semiconductor device 100 according to the embodiment will be described.

FIGS. 5A to 9B are process cross-sectional views illustrating an example of a manufacturing procedure of a semiconductor device 100 according to the embodiment. Here, diagrams corresponding to the cross-sections taken along lines A-A', B-B', C-C' and D-D' shown in FIG. 4A are illustrated.

Hereinafter, only a process for an area in which an n-type transistor is formed will be described.

Figure 5A:
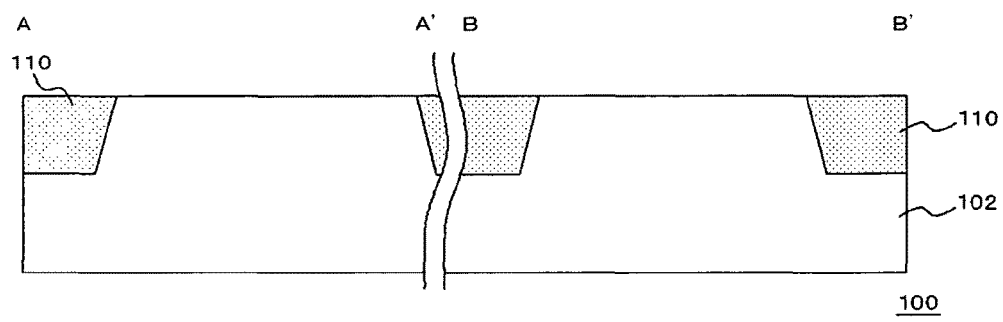
FIGS. 5A and 5B are process cross-sectional views illustrating an example of a manufacturing procedure of a semiconductor device according to an embodiment of the present invention.

First, an element isolation insulating film 110 is formed on a side of a substrate 102 (FIG. 5A). The element isolation insulating film 110, for example, can be formed based on a shallow trench isolation (STI) technique. Here, although not particularly limited, the film thickness of the element isolation insulating film 110, for example, may be in the range of about 300 nm to 1 μm.

Figure 5B:
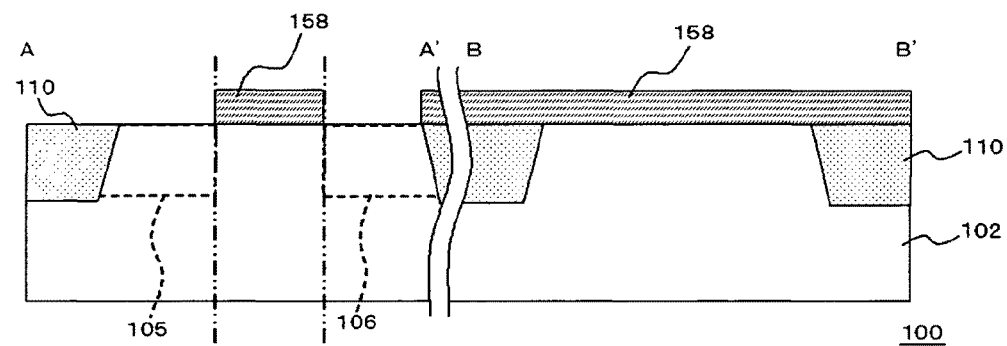

Subsequently, on a side of the substrate 102, a resist film 158 with openings used for forming offset regions 105 and 106 is formed. Thereafter, the offset regions 105 and 106 are formed by performing ion implantation with impurity ions of the n-type (the first conductive type) such as phosphorus with respect to the entire upper face of the substrate 102 using the resist film 158 as a mask (FIG. 5B). Here, the density of the n-type impurity of the offset regions 105 and 106, for example, may be in the range of about $1 \times 10^{16}$ atoms/cm$^3$ to $1 \times 10^{18}$ atoms/cm$^3$. Thereafter, the resist film 158 is removed.

Subsequently, although not illustrated in any figure, a resist film with an opening used for forming a well 104 is formed, on the substrate 102. Thereafter, the well 104 is formed by performing ion implantation of impurity ions of the p-type (the second conductive type) such as boron (B) with respect to the entire upper face of the substrate 102 with the resist film used as a mask. Here, the density of the p-type impurity of the well 104, for example, may be in the range of about $1 \times 10^{15}$ atoms/cm$^3$ to $1 \times 10^{17}$ atoms/cm$^3$. Thereafter, the resist film is removed.

Subsequently, a thermal oxide film 160 is formed on one side of the substrate 102, and a resist film 170 with a plurality of opening portions 172 used for forming trenches 162 is formed on the thermal oxide film 160. Here, all the widths of the plurality of opening portions 172 in the longitudinal direction of the gate are formed to be the same. In addition, the gaps between adjacent opening portions 172 in the longitudinal direction of the gate may be formed to be the same.

Figure 6A:
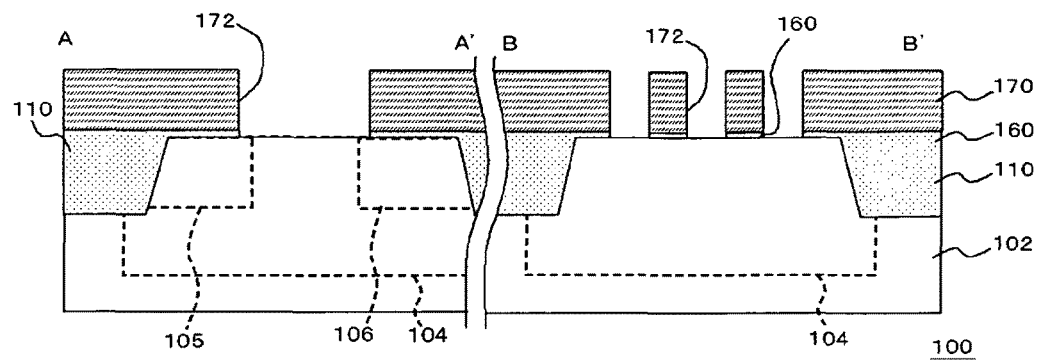
FIGS. 6A and 6B are process cross-sectional views illustrating an example of a manufacturing procedure of a semiconductor device according to an embodiment of the present invention.
Figure 6B:
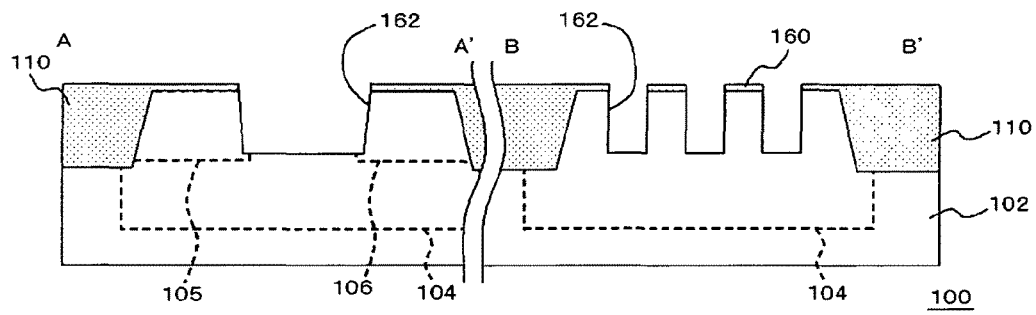

Thereafter, the thermal oxide film 160 is etched so as to be removed with the resist film 170 used as a mask, so that the surface of the substrate 102 is exposed inside the opening portion 172 (FIG. 6A). Thereafter, the resist film 170 is removed, and plasma etching is performed for the substrate 102 inside the opening portion with the thermal oxide film 160 used as a mask so as to form a plurality of trenches 162 (FIG. 6B). In the embodiment, the trench 162, for example, can be formed to have a depth in the range of about 500 nm to 2 μm. Thereafter, the resist film 170 is removed.

Figure 7A:
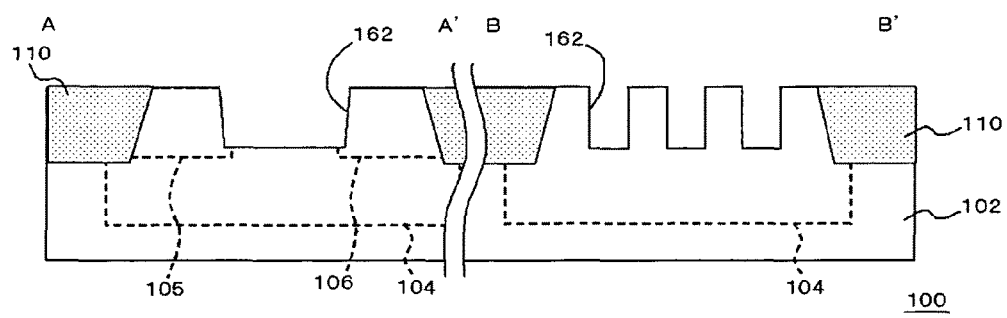
FIGS. 7A and 7B are process cross-sectional views illustrating an example of a manufacturing procedure of a semiconductor device according to an embodiment of the present invention.
Figure 7B:
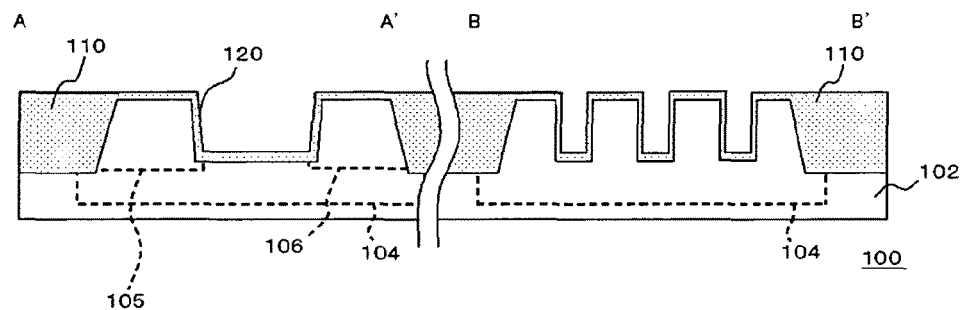

Thereafter, the thermal oxide film 160 is removed by using dilute hydrofluoric acid or the like (FIG. 7A), and then, the surface of the substrate 102 is thermally oxidized so as to form the gate insulating film 120 inside the trench 162 and on the surface of the substrate 102 (FIG. 7B).

In addition, as another method of forming the trench 162, the trench 162 may be formed by leaving the resist film 170, and using the resist film 170 and the thermal oxide film 160 as a mask. In such a case, after the trench 162 is formed, the resist film 170 is removed, and then the thermal oxide film 160 is removed.

Figure 8A:
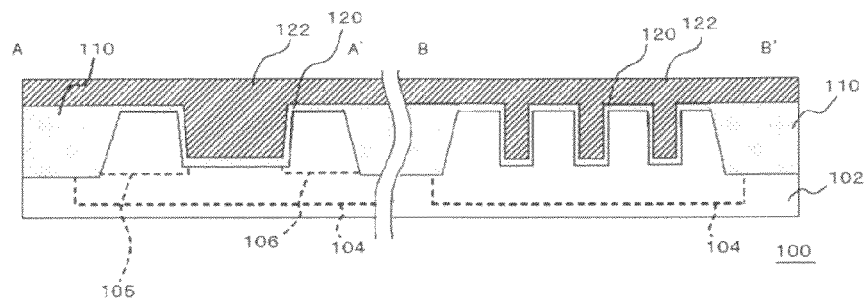
FIGS. 8A to 8D are process cross-sectional views illustrating an example of a manufacturing procedure of a semiconductor device according to an embodiment of the present invention.
Figure 8B:
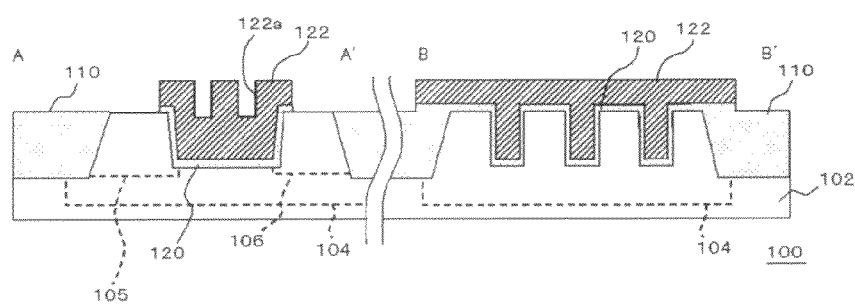
Figure 8C:
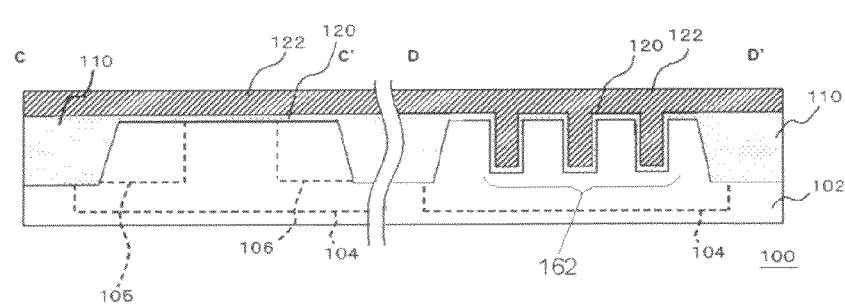
Figure 11:
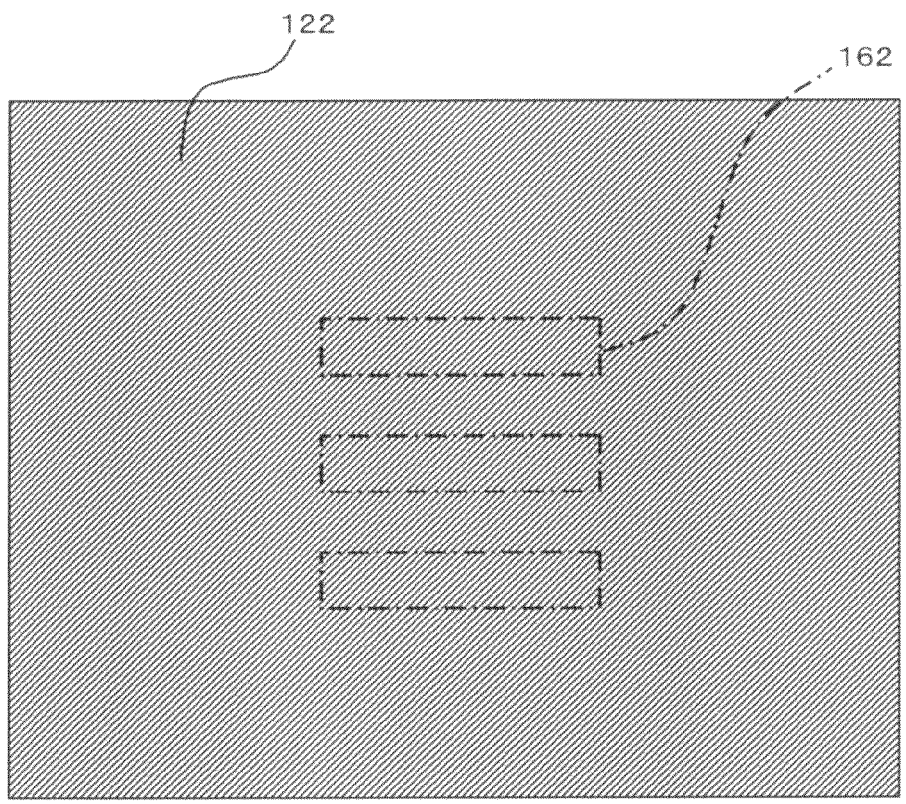
FIG. 11 is a plan view illustrating an example of the configuration of a semiconductor device according to an embodiment of the present invention during a manufacturing process.

Thereafter, a conductive film to be a gate electrode 122 is formed on the entire upper surface of the substrate 102 (FIGS. 8A and 8C). Here, the conductive film to be the gate electrode 122, for example, may be composed of polysilicon. A plan view at this time is illustrated in FIG. 11. Here, for convenience of the description, the trench 162 is illustrated by a broken line.

Figure 12A:
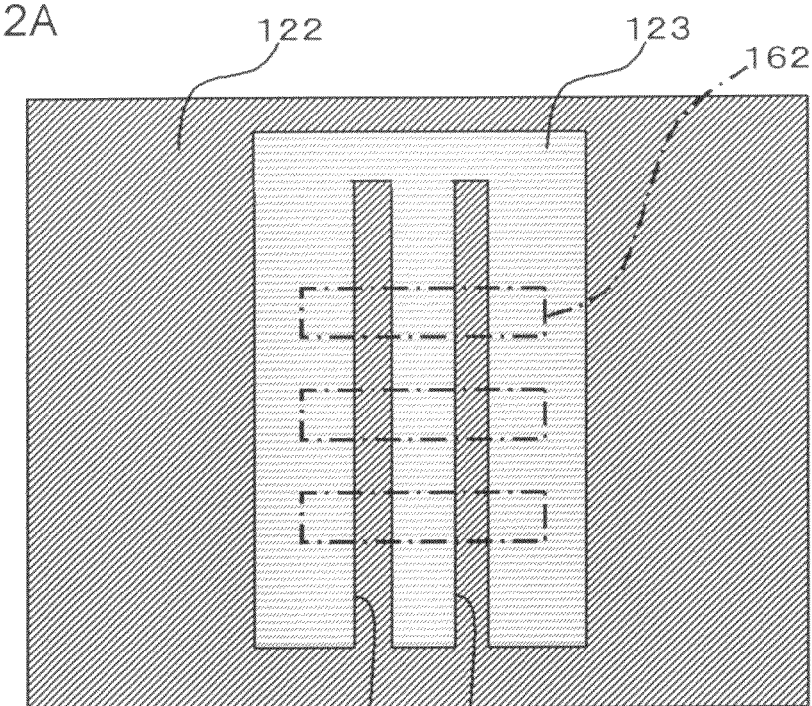
FIGS. 12A and 12B are plan views illustrating an example of the configuration of a semiconductor device according to an embodiment of the present invention during a manufacturing process.
Figure 12B:
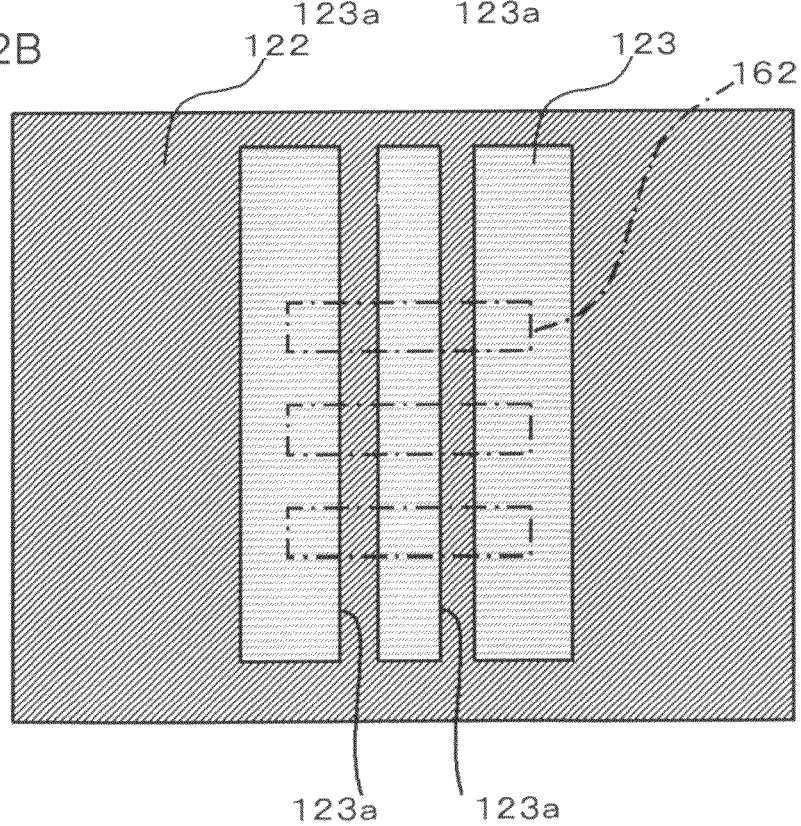

Subsequently, a resist film 123 having a predetermined shape is formed on the conductive film to be the gate electrode 122 (FIGS. 12A and 12B). Here, a concave portion 123a is provided in the resist film 123. The concave portion 123a is formed so as to leave an area, which is to be a channel region 108 and in which the trench 162 is formed, being covered. In addition, the concave portion 123a is formed such that both upper end portions of the trench 162 are covered but the center portion of the trench 162 is uncovered, in the longitudinal direction of the gate. Here, two concave portions 123a are provided along the longitudinal direction of the gate.

Figure 8D:
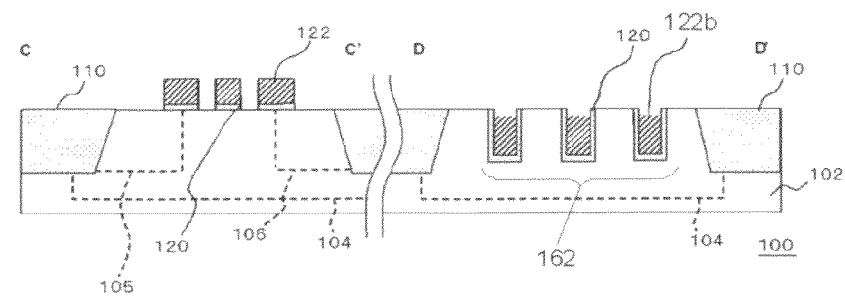

Referring back to FIGS. 8A and 8C, subsequently, the gate electrode 122 and the gate insulating film 120 are patterned in the gate shape with the resist film 123 used as a mask (FIGS. 8B and 8D). Accordingly, in the gate electrode 122, a concave portion 122a is formed on the cross-section taken along lines A-A' and C-C' illustrated in FIGS. 4A and 4B is formed, and a concave portion 122b is formed on the cross-section taken along line D-D'. In other words, according to the embodiment, here, the gate electrode 122 and the gate insulating film 120 have the concave portion 122a formed such that, in the longitudinal direction of the gate, both upper end portions of the trench 162 are covered but the center portion of the trench 162 is uncovered. Here, two concave portions 122a are arranged along the longitudinal direction of the gate. Next, three concave portions 122b are arranged along the widthwise direction of the gate. In addition, in this example, although the gate insulating film 120 is patterned using the gate electrode 122 as a mask, the patterning of the gate insulating film 120 may not be performed. Furthermore, the gate insulating film 120 may be patterned at timing when a side wall 124 is formed, without performing patterning of the gate insulating film 120 in this stage. In addition, it may be configured such that, after the resist film 123 is removed, an additional resist film (not shown in the drawing) is formed as necessary, the etching conditions are changed by using the resist film, and the gate insulating film 120 positioned on a diffusion layer is removed by patterning using the resist film.

Figure 9A:
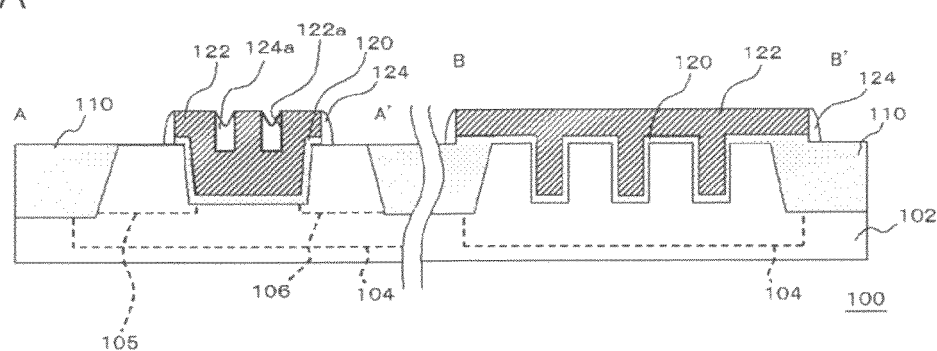
FIGS. 9A and 9B are process cross-sectional views illustrating an example of a manufacturing procedure of a semiconductor device according to an embodiment of the present invention.
Figure 9B:
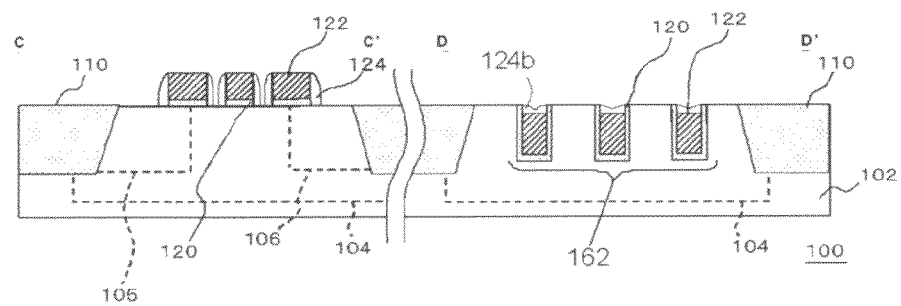

Thereafter, the side wall 124 is formed on the side wall of the gate electrode 122 (FIGS. 9A and 9B). The side wall 124 can be configured by an insulating film such as an oxide film or a nitride film. Here, by configuring the width of the concave portion 122a formed in the gate electrode 122 on the cross-section taken along line A-A' (or the cross-section taken along line C-C') to be narrow, the concave portion 122a can be buried with the same insulating film 124a as that configuring the side wall 124 when the side wall 124 is formed. FIG. 9A illustrates an example in which the concave portion 122a is buried with the insulating film 124a.

Similarly, by configuring the width of a groove that is formed by the trench 162 and the gate insulating film 120, in the cross-section taken along line D-D', to be narrow, the concave portion 122b can be buried with the same insulating film 124b as that configuring the side wall 124 when the side wall 124 is formed. FIG. 9B illustrates an example in which the concave portion 122b is buried with the insulating film 124b.

Figure 31A:
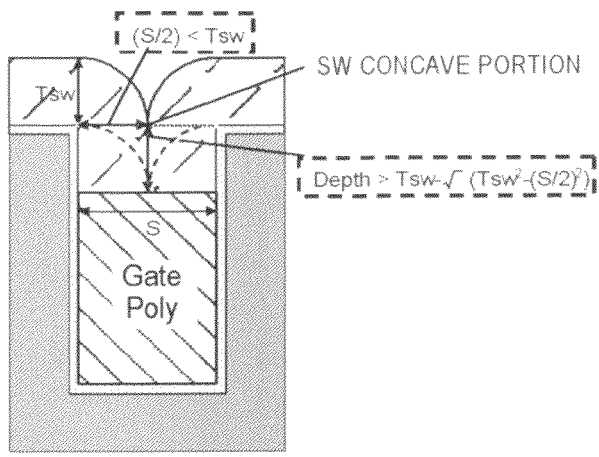
FIGS. 31A to 31C are diagrams illustrating the relationship between a film thickness Tsw of an insulating film at the time of forming a side wall 124, a groove width S of a groove formed by a trench 162 and a gate insulating film 120 in the gate width direction, and a depth $D_{epth}$ from the surface of a gate electrode 122 inside the trench 162 to the surface of a substrate 102, according to an embodiment of the present invention.
Figure 31B:
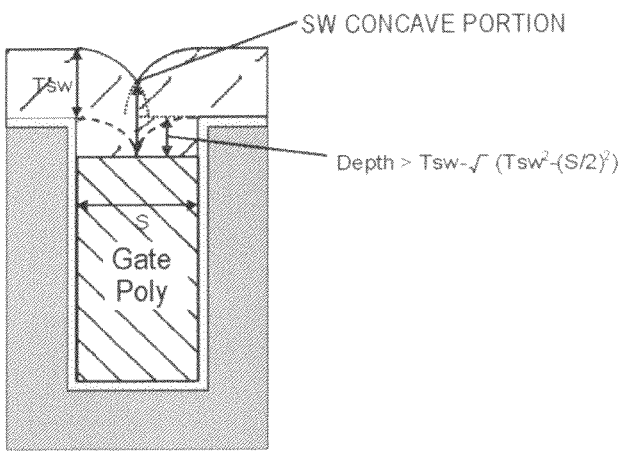
Figure 31C:
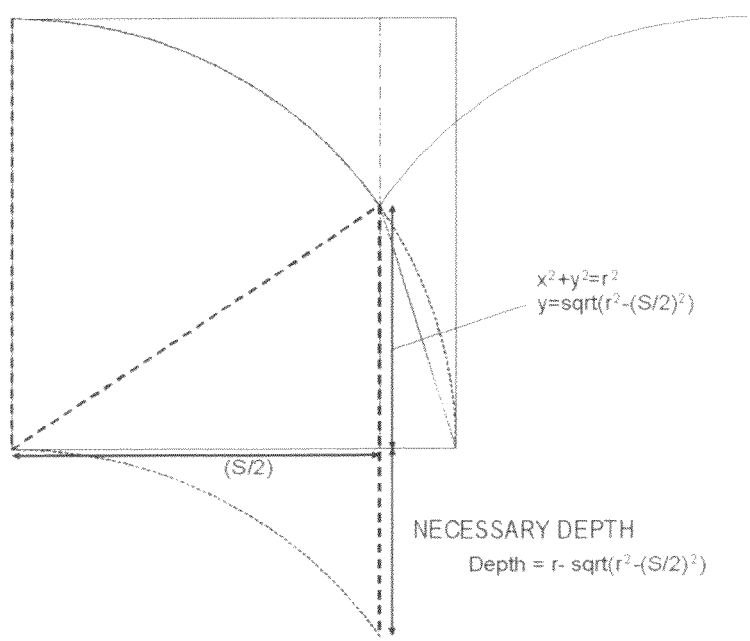

FIGS. 31A to 31C are diagrams illustrating the relationship among a film thickness Tsw of the insulating film at the time of forming the side wall 124, a groove width S of a groove formed by the trench 162 and the gate insulating film 120 in the gate width direction, and a depth $D_{epth}$ from the surface of the gate electrode 122 inside the trench 162 to the surface of the substrate 102.

In a case where the groove width S is sufficiently small during formation of the side wall 124, the side walls 124 grown from both sides of the groove may be brought into contact with each other so as to completely cover the surface of the gate electrode 122 inside the trench 162. In this case, the relationship is represented as in Equation (1).

$$S/2 < T_{sw} \qquad \text{Equation (1)}$$

In addition, after the side wall 124 is formed, etch-back of an amount corresponding to at least the film thickness Tsw is performed, and the surface of the side wall 124 is etched up to a position denoted by a broken line in the drawing. At that time, in a case where the depth $D_{epth}$ from the surface of the gate electrode 122 to the surface of the substrate 102 is sufficiently large, a state can be maintained in which the surface of the gate electrode 122 is covered with the side wall 124. In such a case, the relationship can be represented as in Equation (2).

$$D_{epth} > T_{sw} - \sqrt{(T_{sw}^2 - (S/2)^2)} \qquad \text{Equation (2)}$$

Generally, the film formation of the side wall 124 is frequently performed by using a CVD-based device, and thus the description presented above is based on an assumption that the film forming rates for the horizontal direction and the vertical direction with respect to the substrate are the same (isotropic growth). However, in a case where the film forming rate varies depending on the direction, it is apparent that Equations (1) and (2) illustrating the relationship can be modified as follows.

$$(S/2) < T_{sw} \times (G_{rx}/G_{ry}) \qquad \text{Equations (1)'}$$

$$D_{epth} > T_{sw} - \sqrt{(T_{sw}^2 - (S/2 \times G_{ry}/G_{rx})^2)} \qquad \text{Equation (2)'}$$

Here, $G_{ry}$ is the film forming rate of an insulating film that is formed on the upper face of the gate electrode, and $G_{rx}$ is the film forming rate of an insulating film that is formed on the side faces of the gate electrode.

Thereafter, ion implantation of n-type impurity ions such as phosphorus is performed with respect to the entire upper face of the substrate 102 by using the gate electrode 122 and the side wall 124 as a mask, thereby forming a source region 112 and a drain region 113. Here, the density of the n-type impurity of the source region 112 and the drain region 113, for example, may be in the range of about $1 \times 10^{20}$ atoms/cm$^3$ to $1 \times 10^{22}$ atoms/cm$^3$.

Subsequently, silicide layers 114 and 126 are formed on the surface of the substrate 102 and the surface of the gate electrode 122. Thereafter, an interlayer insulating film 140 is formed on the entire upper face of the substrate 102, a contact hole is formed in the interlayer insulating film 140, and the contact hole is buried in a conductive material, thereby forming contacts 150 and 154. Accordingly, a semiconductor device 100 having the configuration illustrated in FIGS. 1A to 4B can be acquired.

Figure 10A:
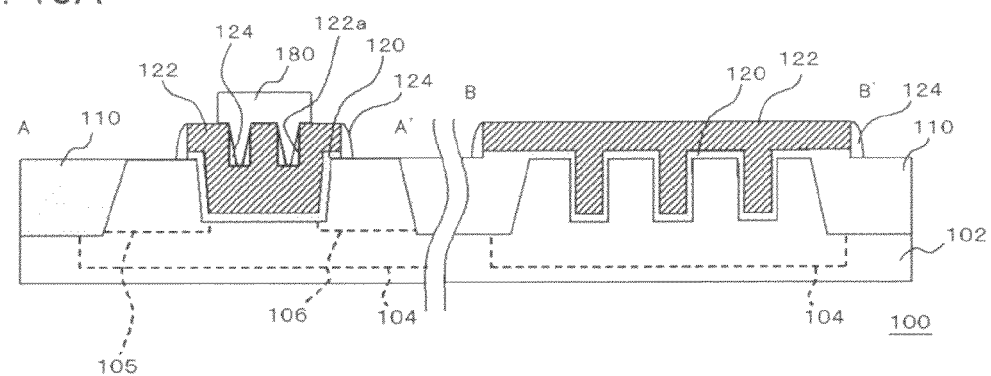
FIGS. 10A and 10B are process cross-sectional views illustrating another example of a manufacturing procedure of a semiconductor device according to an embodiment of the present invention.
Figure 10B:
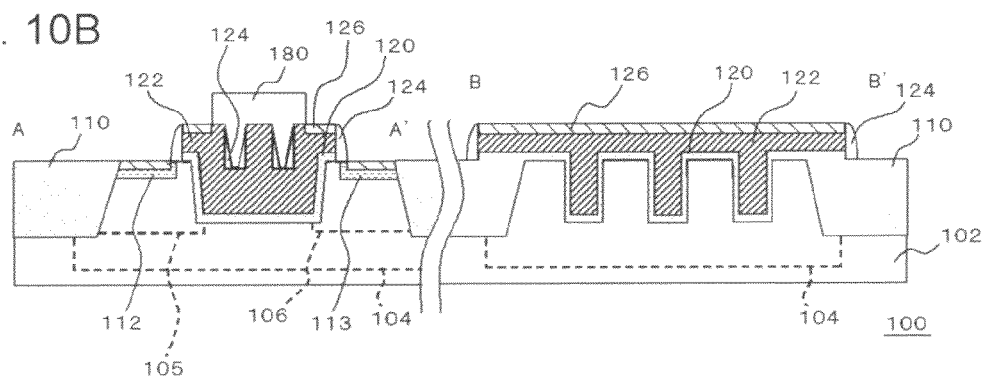
Figure 30A:
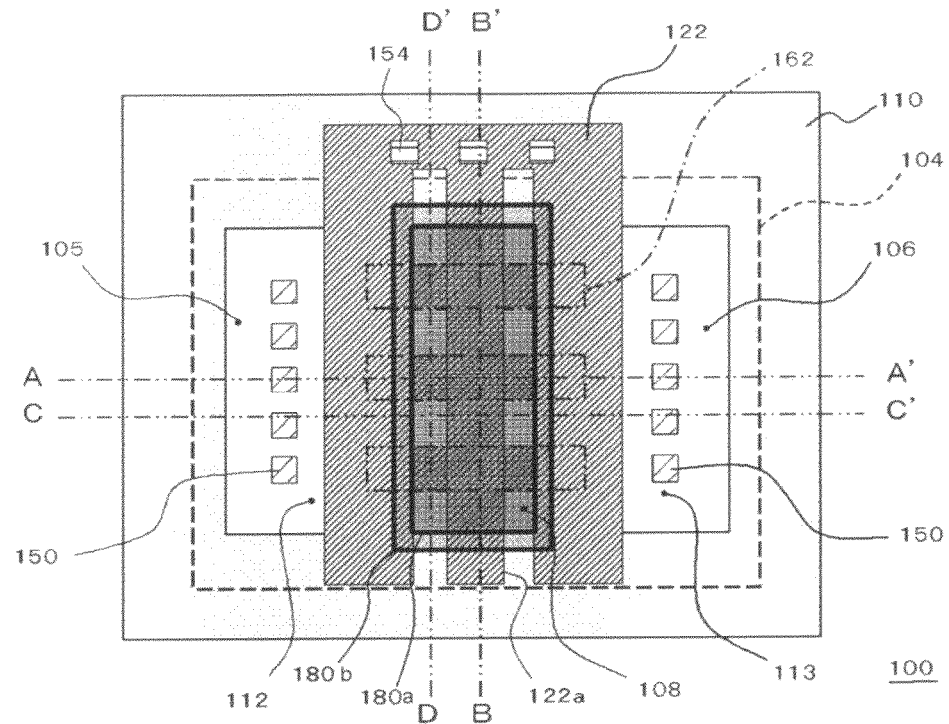
FIGS. 30A and 30B are plan views illustrating a region, in which a silicide block film 180 is formed, according to an embodiment of the present invention.
Figure 30B:
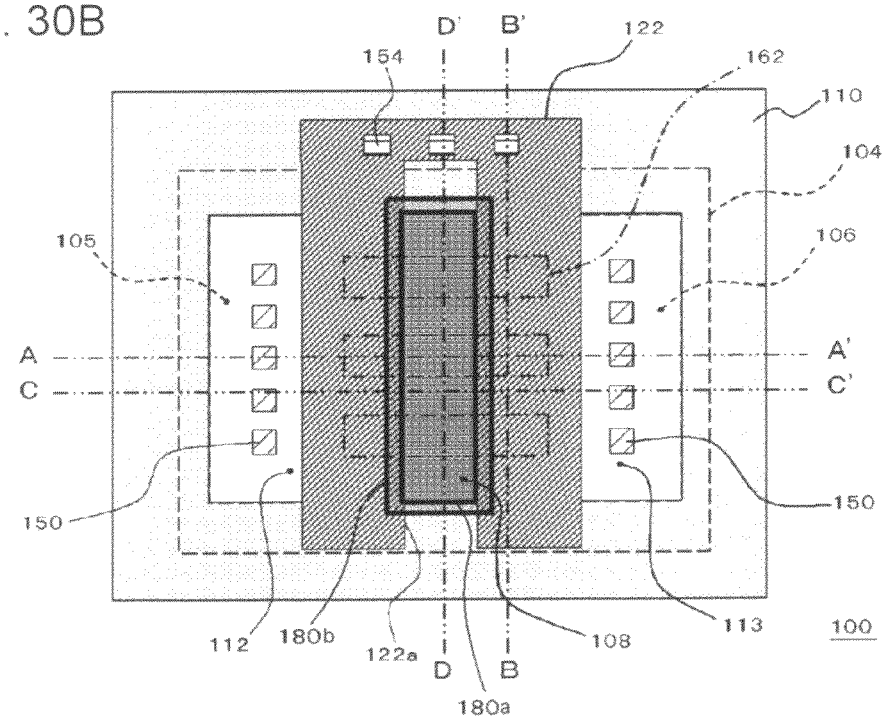

On the other hand, in the procedure illustrated in FIGS. 9A and 9B, in a case where the width of the concave portion 122*a* formed in the gate electrode 122 on the cross-section taken along line A-A' (or the cross-section taken along line C-C') is large, and the concave portion 122*a* is not buried in the insulating film 124*a*, after the insulating film 124*a* is formed, an insulating film in which the concave portion 122*a* is buried can be formed. FIGS. 10A and 10B are process cross-sectional views illustrating the procedure of this case. FIGS. 30A and 30B are plan views illustrating a region in which a silicide block film 180 is formed.

Similarly to the description presented with reference to FIGS. 9A and 9B, after the side wall 124 is formed, the silicide block film 180 is formed on the entire upper face of the substrate 102. Thereafter, the silicide block film 180 is patterned so as to selectively cover the upper side of the concave portion 122*a* of the gate electrode 122, so that both end portions of the gate electrode 122 in the longitudinal direction of the gate and the surface of the substrate 102 are exposed (FIG. 10A). In the plan views illustrated in FIGS. 30A and 30B, the region 180*a* in which the silicide block film is formed is formed from one side of the concave portion over to the other side thereof in the longitudinal direction of the gate in a case where there is one concave portion. On the other hand, in a case where there is a plurality of concave portions, the region 180*a* is formed so as to cover the gate electrode interposed between the concave portions, so that the region 180*a* is formed from one boundary between the element isolation insulating film and the element forming region over to the other boundary in a direction perpendicular to the longitudinal direction of the gate. In addition, in consideration of misalignment originating from the precision of an exposure device, an extension region 180*b* (a portion overlapping the gate electrode or the element isolation insulating film) of the silicide block film is formed by from 0.06 μm to 0.3 μm on the outer peripheral area of the region 180*a* in which the silicide block film is formed. For correction of the misalignment, 0.06 μm is necessary for a high-precision exposure device, and 0.3 μm is necessary for a general exposure device (FIGS. 30A and 30B).

Thereafter, on the surface of the substrate 102 and the surface of the gate electrode 122 that is not covered with the silicide block film 180, a silicide layer 114 and a silicide layer 126 are formed (FIG. 10B). Thereafter, an interlayer insulating film 140 is formed on the entire upper face of the substrate 102, a contact hole is formed in the interlayer insulating film 140, the contact hole is buried in a conductive material, and thereby forming contacts 150 and 154. Accordingly, a semiconductor device 100 having a configuration that is approximately similar to that illustrated in FIGS. 1A to 4B can be acquired.

Figure 13:
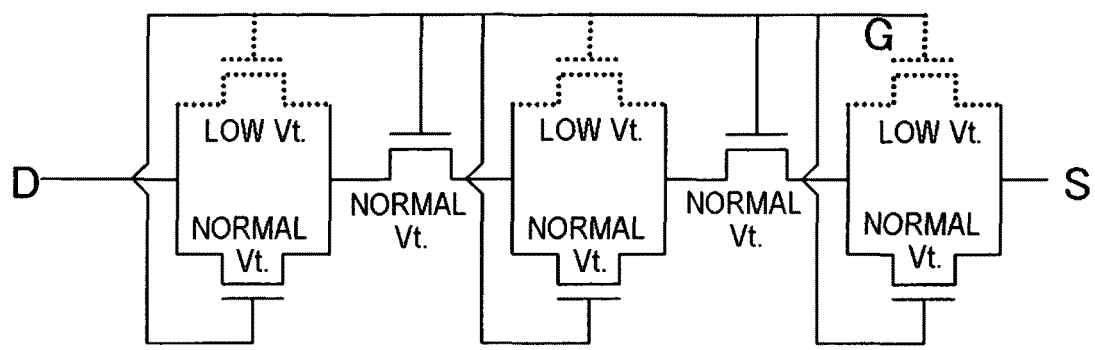
FIG. 13 is a diagram illustrating the advantages of a semiconductor device according to an embodiment of the present invention.

FIG. 13 is a diagram illustrating the advantages of the configuration of a semiconductor device according to the embodiment. According to the embodiment, within an area located on the channel region 108, that is, within an area in which the gate electrode 122 is not formed on the surface of the substrate 102 and the concave portion 122*a* is arranged, a configuration can be formed in which only a transistor operating with a threshold voltage that is the originally designed value is disposed. Accordingly, in both upper end portions of the trench 162 in the longitudinal direction of the gate, a configuration is formed in which a transistor (normal Vt) operating with the originally designed threshold value and a transistor (low Vt) that starts to operate with a threshold voltage lower than the designed value are connected in parallel. However, in an area located in the center portion, that is, in an area in which the concave portion 122*a* is arranged and the gate electrode 122 is not formed on the upper portions, only a transistor (normal Vt) that operates with the originally designed threshold voltage is present, and accordingly, the transistors operating with the originally designed threshold voltage are connected in series as a whole. Accordingly, the operation of a parasitic transistor starting to operate with a threshold voltage that is lower than the designed threshold voltage can be suppressed, whereby occurrence of hump can be suppressed.

Particularly, in the case of the n-type transistor described in the above-described embodiment, boron is frequently used as an impurity implanted for controlling the threshold value of the channel region 108, and it is easy for boron to be particularly rediffusing toward the inside of the gate insulting film through a heat treatment process performed in the course of manufacturing. Particularly, in the upper end portions of the trench, the gate insulating film is present in the horizontal direction of the side faces of the trench and the upward direction of the substrate surface, and accordingly, a prominent problem occurs in which the density of the impurity may easily decreases. However, according to the semiconductor device 100 of the embodiment, even in a case where the density of the impurity is low in the upper end portions of the trench, the operation of a parasitic transistor starting to operate with a threshold voltage lower than the designed threshold voltage can be suppressed, whereby the occurrence of hump can be prevented.

In addition, like technologies, for example, disclosed in Japanese Laid-Open patent publication NOS. 2006-294645 and 62-126675, in a case where a configuration is employed in which the gate electrode exposed from the trench is removed at a place brought into contact with the source region and the drain region, the width of the channel region 108 changes, for example, in a case where there is misalignment of the patterning used for forming the concave portion 122*a* in the gate electrode 122 or misalignment of the patterning of the silicide block film 180 when the silicide block film 180 as illustrated in FIGS. 10A and 10B is formed. When such a change occurs, the characteristics of the transistor change, and accordingly, the designed characteristics cannot be obtained. On the other hand, according to the embodiment, the concave portion 122*a* is formed in an area that does not subject the source region 112 or the drain region 113 to a change, the variation in the characteristics of the transistor can be suppressed even in a case where misalignment occurs.

Figure 14A:
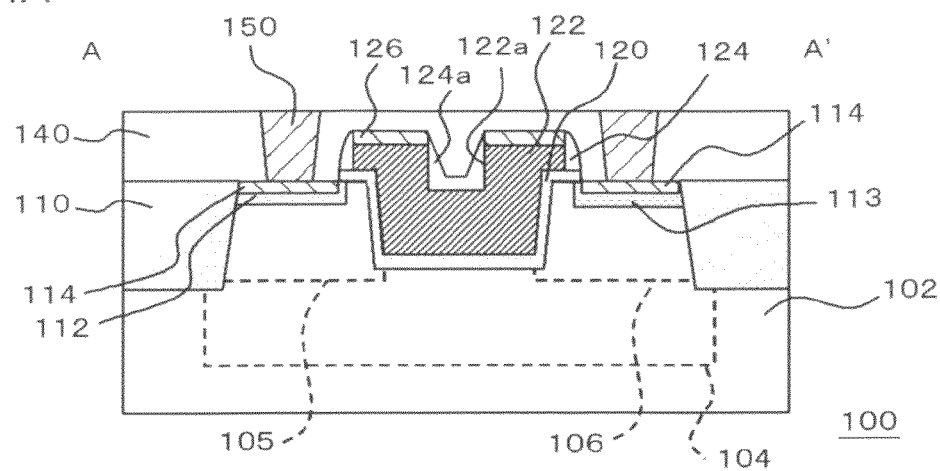
FIGS. 14A and 14B are process cross-sectional views illustrating another example of a manufacturing procedure of a semiconductor device according to an embodiment of the present invention.
Figure 14B:
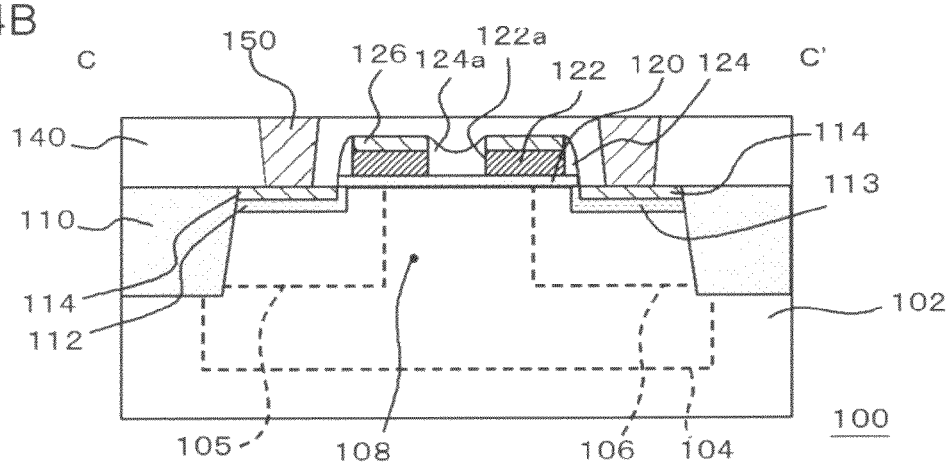
Figure 15:
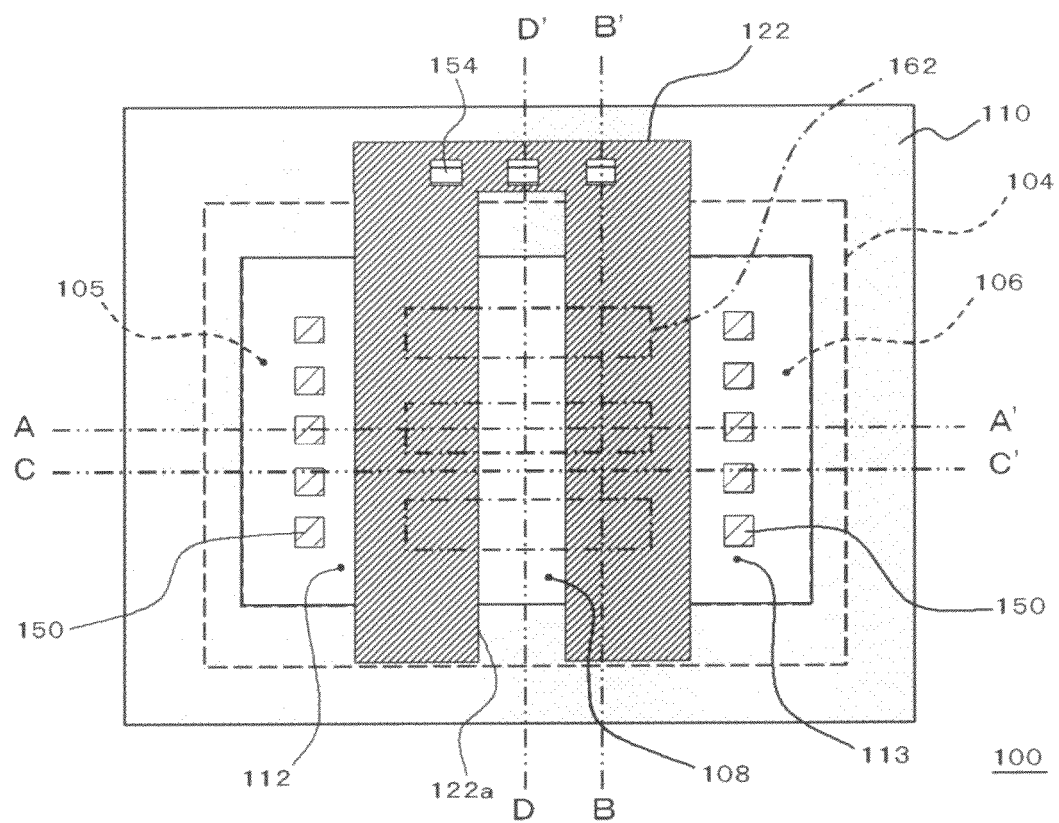
FIG. 15 is a plan view illustrating another example of the configuration of a semiconductor device according to an embodiment of the present invention.

FIGS. 14A, 14B, 15 are diagrams illustrating another example of the configuration of a semiconductor device 100 according to the embodiment. FIG. 15 is a plan view illustrating the configuration of the semiconductor device 100 of this example, FIG. 14A is a cross-sectional view taken along line A-A' shown in FIG. 15, and FIG. 14B is a cross-sectional view taken along line C-C' shown in FIG. 15. Here, an example is illustrated in which the gate insulating film 120 is patterned without using the gate electrode 122 as a mask. However, as described with reference to FIGS. 8A to 8D, the gate insulating film 120 may be patterned by using the gate electrode 122 as a mask. The cross-sectional views taken along lines B-B' and D-D' shown in FIG. 15 are similar to FIGS. 2A and 2B except that the gate insulating film 120 is not patterned using the gate electrode 122. In other words, this example is only different from the example illustrated in FIG. 2B in that the gate insulating film 120 remains on the surface of the substrate 102 under the insulating film 124*a*.

Here, only one concave portion 122a is arranged in the center portion of the gate electrode 122 in the longitudinal direction of the gate, which is different from the example described with reference to FIGS. 1A to 13. Also in this case, the same advantages as those of the example described with reference to FIGS. 1A to 13 can be acquired.

Figure 16:
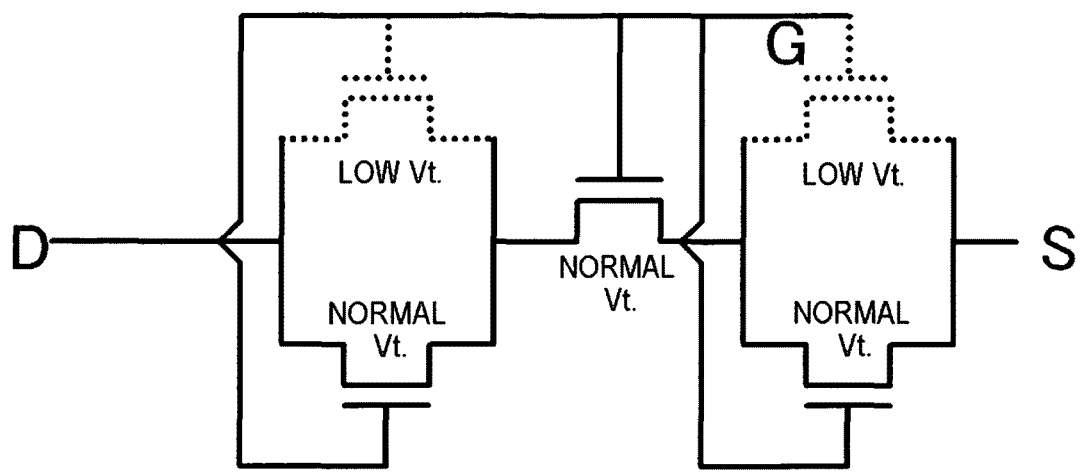
FIG. 16 is a diagram illustrating the advantages of a semiconductor device according to an embodiment of the present invention.
Figure 17:
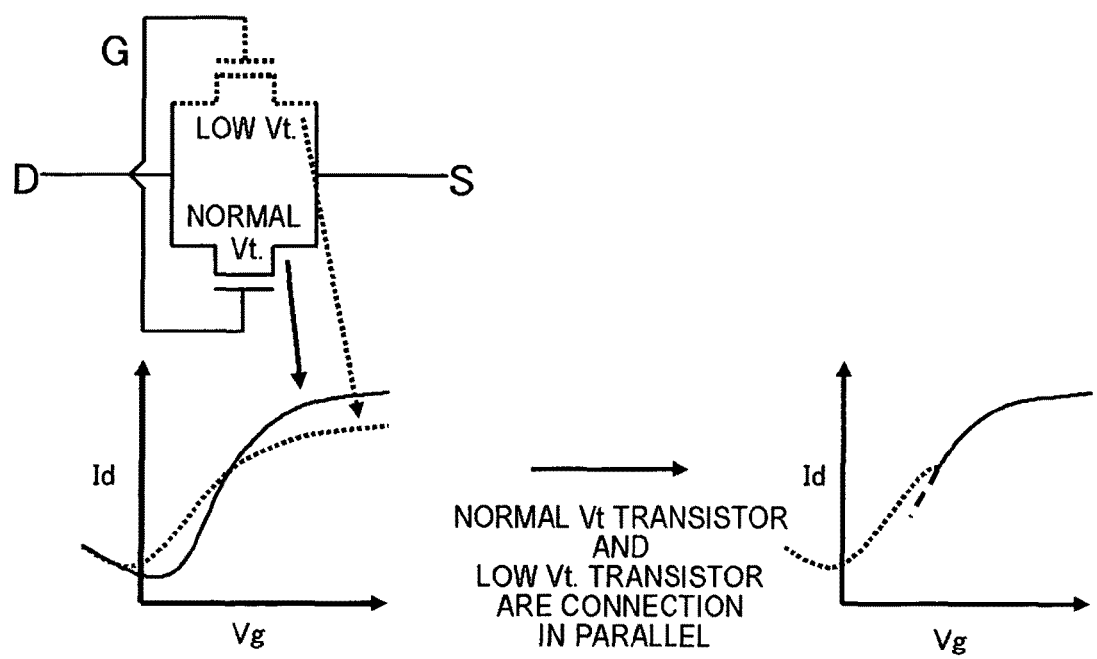
FIG. 17 is a diagram illustrating a conventional problem.

FIG. 16 is a diagram illustrating the advantages of the configuration of the semiconductor device of this example. Also in this example, in an area located on the channel region 108 in which the gate electrode 122 is not formed on the surface of the substrate 102, and the concave portion 122a is arranged, a configuration can be formed in which only a transistor operating with a threshold voltage that is the originally designed value is disposed. Accordingly, in both upper end portions of the trench 162 in the longitudinal direction of the gate, a configuration is formed in which a transistor (normal Vt) operating with the originally designed threshold value and a transistor (low Vt) that starts to operate with a threshold voltage lower than the designed value are connected in parallel. However, in an area located in the center portion, in which the concave portion 122a is arranged, and the gate electrode 122 is not formed on the upper portions, only a transistor (normal Vt) that operates with the originally-designed threshold voltage is present, and accordingly, the transistors operating with the originally-designed threshold voltage are connected in series as a whole. Accordingly, the operation of a parasitic transistor starting to operate with a threshold voltage that is lower than the designed threshold voltage can be suppressed, whereby occurrence of hump can be suppressed.

(Second Embodiment)

In a semiconductor device according to the embodiment, a configuration is employed in which the operation of a parasitic transistor that may be formed near the lower portions of the trench 162 is suppressed in addition to the configuration of the semiconductor device according to the first embodiment. The semiconductor device according to the embodiment will now be described in detail.

Figure 18:
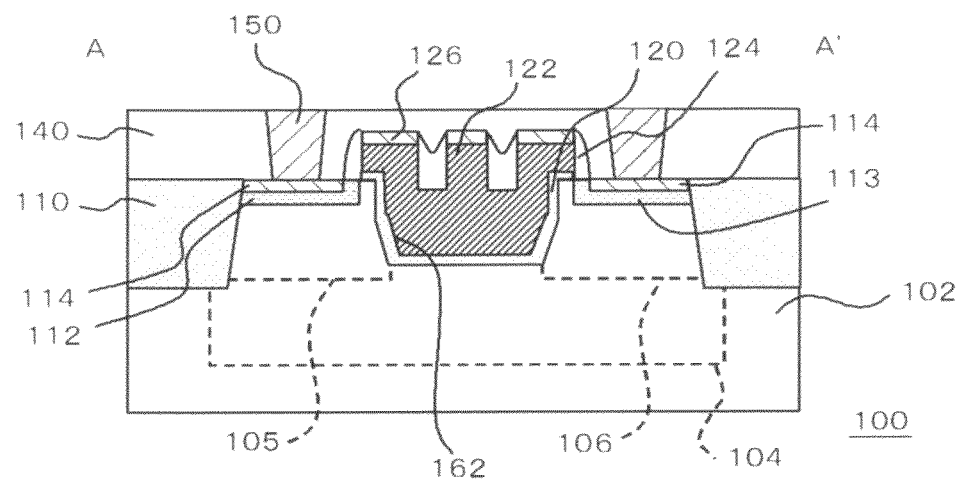
FIG. 18 is a cross-sectional view illustrating an example of the configuration of a semiconductor device according to an embodiment of the present invention.
Figure 19A:
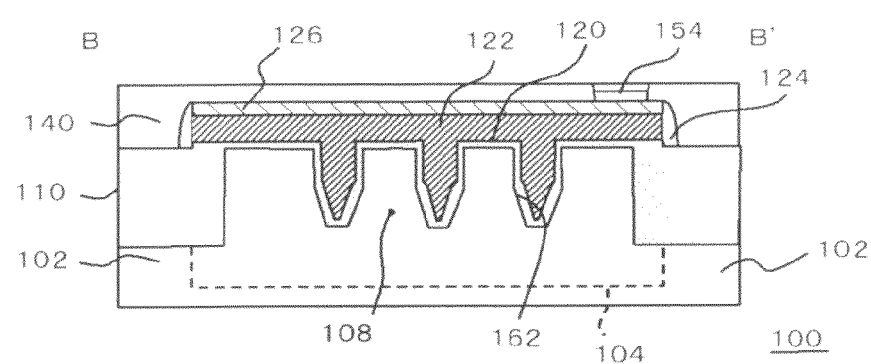
FIGS. 19A and 19B are cross-sectional views illustrating an example of the configuration of a semiconductor device according to an embodiment of the present invention.
Figure 19B:
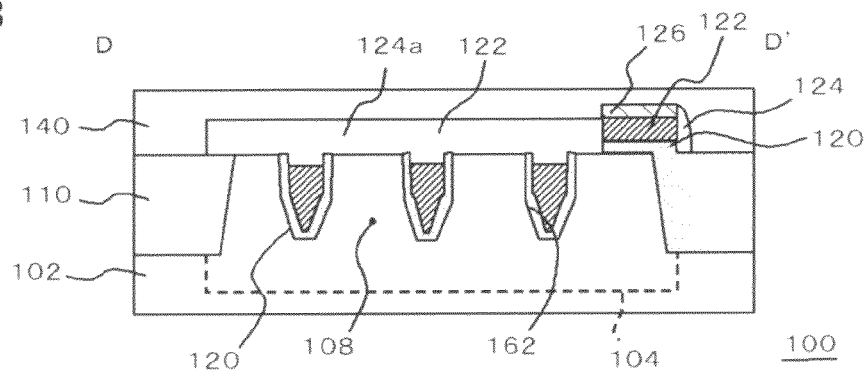

According to the embodiment, the planar structure of the semiconductor device 100 is the same as that illustrated in FIGS. 4A and 4B. FIGS. 18, 19A, and 19B are cross-sectional views illustrating an example of the configuration of a semiconductor device according to the embodiment. FIG. 18 is a cross-sectional view taken along line A-A' shown in FIG. 4A, FIG. 19A is a cross-sectional view taken along line B-B' shown in FIG. 4A, and FIG. 19B is a cross-sectional view taken along line D-D' shown in FIG. 4A.

Figure 20:
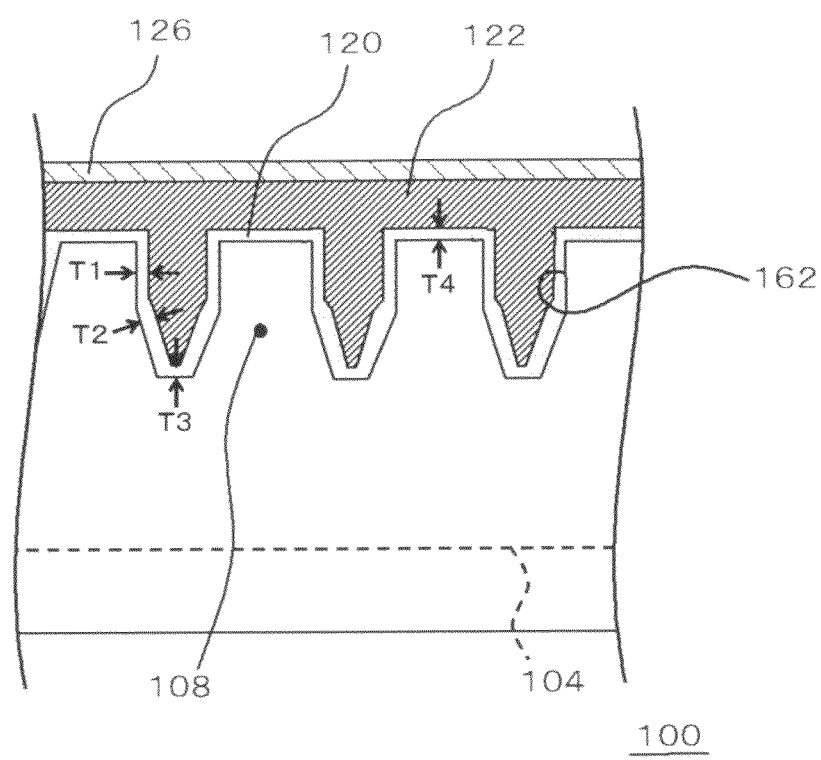
FIG. 20 is a cross-sectional view illustrating an example of the configuration of a semiconductor device according to an embodiment of the present invention.

Here, FIG. 20 illustrates an enlarged cross-sectional view of a trench 162 illustrated in FIG. 19A. As illustrated in the diagram, a gate insulating film that is formed along the side faces of the trench 162 is formed such that the film thickness T2 of the gate insulating film 120 formed along the lower portions (hereinafter, referred to as "lower portions of the side faces of the trench") from a predetermined height (designed item) of the side faces of the trench 162 is formed to be thicker than the film thickness T1 of the gate insulating film 120 formed along the upper portions (hereinafter, referred to as "upper portions of the side faces of the trench") from the predetermined height (designed item). In addition, the film thickness T2 of the gate insulating film 120 formed along the lower portions of the side faces of the trench can be configured to be equal to or more than the film thickness T3 of the gate insulating film 120 formed on the bottom face of the trench 162. Furthermore, although not particularly limited, according to this embodiment, the film thickness T2 of the gate insulating film 120 formed along the lower portions of the side faces of the trench can be configured to be equal to or more than the film thickness T4 of the gate insulating film 120 formed on the surface of the substrate 102. In addition, the film thickness T3 of the gate insulating film 120 formed on the bottom face of the trench 162 can be formed thin so as to be in the same level as that of the film thickness T1 of the gate insulating film 120 formed along the upper portions of the side faces of the trench to a degree not affecting the transistor breakdown voltage and the like. For example, the film thickness T3 of the gate insulating film 120 formed on the bottom face of the trench 162 may be the same as the film thickness T1 of the gate insulating film 120 formed along the upper portions of the side faces of the trench.

In the example illustrated in FIG. 20, the film thickness T2 of the gate insulating film 120 formed along the lower portions of the side faces of the trench are formed to be thicker than the film thickness T3 of the gate insulating film 120 formed on the bottom face of the trench 162. In addition, in this example, the film thickness T2 of the gate insulating film 120 formed along the lower portions of the side faces of the trench are formed to be thicker than the film thickness T4 of the gate insulating film 120 formed on the surface of the substrate 102.

In addition, in the example illustrated in FIG. 20, the angle of the corner portions that are formed between the bottom face and one of the side faces of the trench 162 are higher than 90 degrees. With such a configuration, the concentration of electric field in the corner portion can be alleviated.

Next, the manufacturing procedure of a semiconductor device 100 according to the embodiment will be described.

FIGS. 21A to 24B are process cross-sectional views illustrating an example of a manufacturing procedure of a semiconductor device 100 according to the embodiment. Here, diagrams corresponding to the cross-sections taken along lines A-A' and B-B' shown in FIG. 4A are illustrated. Hereinafter, only a process for an area in which an n-type transistor is formed will be described.

Figure 21A:
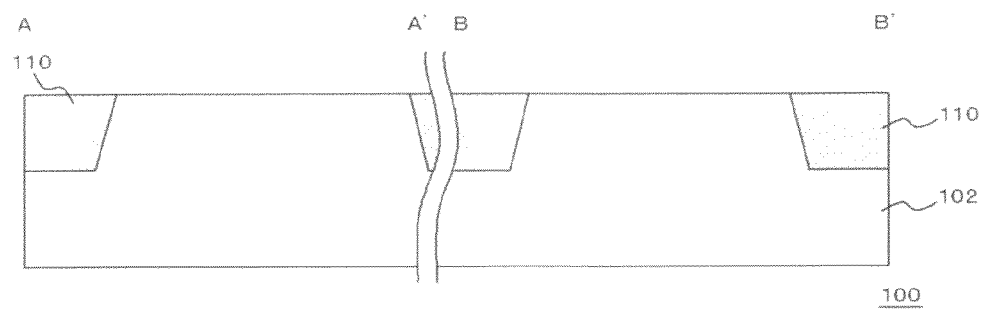
FIGS. 21A and 21B are process cross-sectional views illustrating an example of a manufacturing procedure of a semiconductor device according to an embodiment of the present invention.

First, an element isolation insulating film 110 is formed on one side of a substrate 102 (FIG. 21A). The element isolation insulating film 110, for example, can be formed based on an STI technique. Here, although not particularly limited, the film thickness of the element isolation insulating film 110, for example, may be in the range of about 300 nm to 1 μm. In addition, according to the embodiment, the plan orientation of the surface of the substrate 102 and a face arranged in the direction perpendicular to the surface can be configured (100) plane (see Japanese Laid-Open patent publication NO. 2007-81396).

Figure 21B:
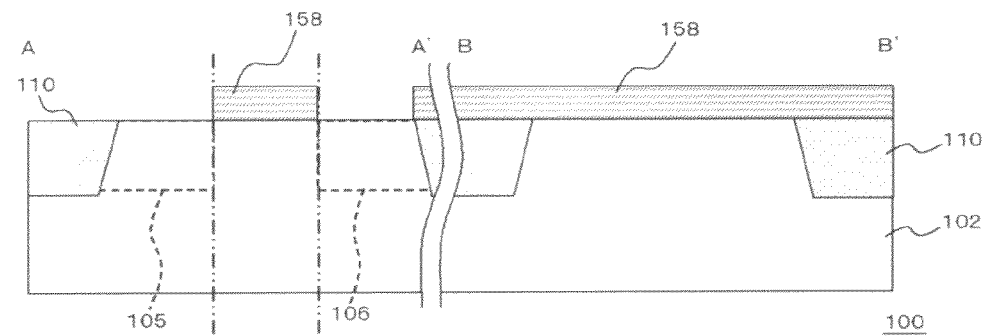

Subsequently, on one side of the substrate 102, a resist film 158 is formed in which areas used for forming offset regions 105 and 106 are open. Thereafter, the offset regions 105 and 106 are formed by performing ion implantation of impurity ions of the n-type (the first conductive type) such as phosphorus with respect to the entire upper face of the substrate 102 with a resist film 158 used as a mask (FIG. 21B). Here, the density of the n-type impurity of the offset regions 105 and 106, for example, can be in the range of about $1 \times 10^{16}$ atoms/$cm^3$ to $1 \times 10^{18}$ atoms/$cm^3$. Thereafter, the resist film 158 is removed.

Subsequently, although not shown in the drawing, a resist film is formed, in which an area used for forming a well 104 is open, on the substrate 102. Thereafter, the well 104 is formed by performing ion implantation of impurity ions of the p-type (the second conductive type) such as boron (B) with respect to the entire upper face of the substrate 102 with the resist film used as a mask. Here, the density of the p-type impurity of the well 104, for example, can be in the range of about 1E15 atoms/cm³ to 1E17 atoms/cm³. Thereafter, the resist film is removed.

Subsequently, a thermal oxide film 160 is formed on one side of the substrate 102, and a resist film 170 with a plurality of opening portions 172 used for forming trenches 162 is formed thereon. Here, all the widths of the plurality of opening portions 172 in the longitudinal direction of the gate are formed to be the same. In addition, the gaps between adjacent opening portions 172 may be formed to be the same.

Figure 22A:
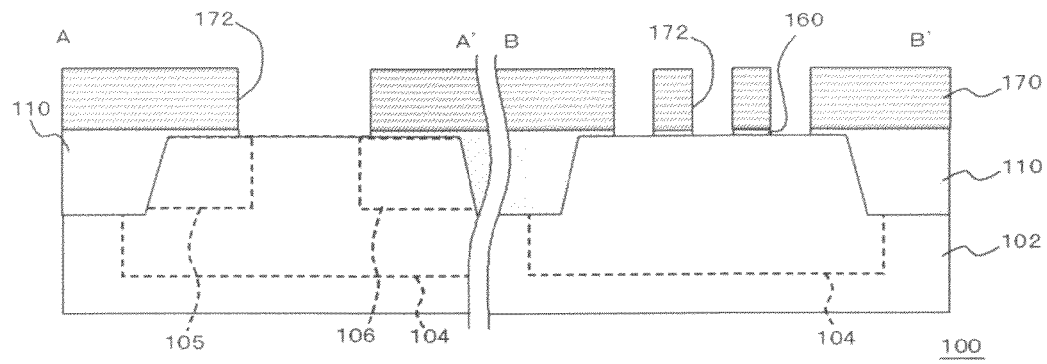
FIGS. 22A and 22B are process cross-sectional views illustrating an example of a manufacturing procedure of a semiconductor device according to an embodiment of the present invention.

Thereafter, the thermal oxide film 160 is etched so as to be removed with the resist film 170 used as mask, so that the surface of the substrate 102 is exposed inside the opening portion 172 (FIG. 22A). Thereafter, the resist film 170 is removed, and plasma etching is performed with respect to the substrate 102 inside the opening portion with the thermal oxide film 160 used as a mask so as to form a plurality of trenches 162.

According to the embodiment, the trench 162 is formed such that the side faces are approximately perpendicular to the in-plane direction of the substrate 102 in the upper portions of the side faces of the trench, and the lower portions of the side faces of the trench have a taper such that the diameter of the trench 162 gradually decreases.

Although a unit used for forming the trench 162 is not particularly limited, hereinafter, an example thereof will be described. First, it may be configured such that the substrate 102 is etched up to a depth in the middle of a designed depth of the trench 162 under a first etching condition (FIG. 22B), and then, the substrate 102 is etched under a second etching condition in which the diameter of the trench formed in the substrate 102 decreases toward the lower side as compared with that under the first etching condition (FIG. 23A). Under the first etching condition, anisotropic etching is performed such that each trench 162a maintains the opening area of the opening portion of a thermal oxide film 160. In other words, the first etching condition may be a condition in which the substrate 102 is etched such that the side faces of the trench 162a are approximately perpendicular to the in-plane direction of the substrate. Under the second etching condition, the substrate 102 is etched such that each trench 162 has a taper so that the diameter gradually decreases up to the bottom face.

In addition, as another example, the substrate 102 may be etched under a condition in which the diameter gradually decreases up to the bottom face when the depth is equal to or more than a specific depth as the depth of the trench 162 increases.

Furthermore, according to the embodiment, the depth (the depth from the surface of the substrate 102 to the bottom face of the trench 162) of the trench 162 may be, for example, in the range of 500 nm and 2 μm.

In a case where the trench 162 is formed as described above, a (100) face is exposed in the upper portions of the side faces of the trench. On the other hand, a face having a deviated plane orientation that is different from that of the (100) face is exposed in the lower portions of the side faces of the trench. In addition, a (100) face is exposed also in the bottom face of the trench 162.

Figure 24A:
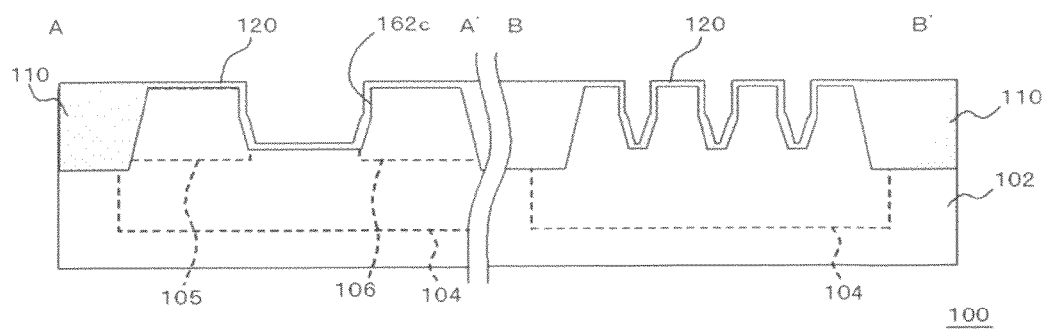
FIGS. 24A and 24B are process cross-sectional views illustrating an example of a manufacturing procedure of a semiconductor device according to an embodiment of the present invention.

Thereafter, the thermal oxide film 160 is removed by using dilute hydrofluoric acid or the like (FIG. 23B), and then, the surface of the substrate 102 is thermally oxidized so as to form the gate insulating film 120 inside the trench 162 and on the surface of the substrate 102 (FIG. 24A). According to the embodiment, as described above, the plane orientation of each of the surface of the substrate 102, the upper portions 162C of the side faces of the trench, and the bottom face of the trench 162 is the (100) face (see Japanese Laid-Open patent publication NO. 2007-81396). Here, when the thermal oxide film is formed on the silicon substrate, the oxidation speed at the (100) face is the slowest in a case where heating is performed in an ambient of a general mixture of hydrogen and oxygen (for example, Shigeru Nomura and Hisashi Fukuda, "Technology for Forming Ultra-Thin Silicon Oxide Film and Interface Evaluation", pages 28-29, Realize Science & Engineering Center Co., Ltd, published on Jan. 31, 1997). Accordingly, as described with reference to FIG. 20, the film thickness of the gate insulating film 120 that is formed on the surface of the substrate 102, the upper portions 162C of the side faces of the trench, and the bottom face of the trench 162, is thinner than that of the gate insulating film 120 formed in the lower portions of the side faces of the trench.

In addition, as another method of forming the trench 162, the trench 162 may be formed by using the resist film 170 and the thermal oxide film 160 as a mask with the resist film 170 remaining. In such a case, after the trench 162 is formed, the resist film 170 is removed, and then the thermal oxide film 160 is removed.

Figure 24B:
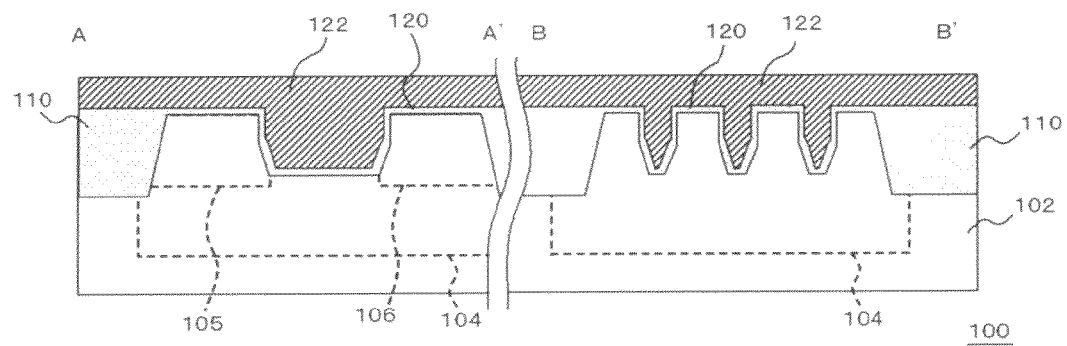

Hereinafter, a conductive film to be a gate electrode 122 is formed so as to allow the trench 162 to be buried therein over the entire upper face of the substrate 102 (FIG. 24B). The process performed thereafter is the same as the subsequent processes of FIG. 8A as described in the first embodiment.

According to the embodiment, in addition to the same advantages as those of the first embodiment, the following operations and advantages can be acquired.

According to the embodiment, by forming the film thickness of the gate insulating film formed in the lower portions of the side faces of the trench to be thicker than that of the gate insulating film formed in the upper portions of the side faces of the trench, the electric field applied to the lower end portions of the channel that are located in the lower portions of the trench can be alleviated, whereby the operation of a parasitic transistor located in the lower portions of the trench can be suppressed. As above, by forming the film thickness of the gate insulating film to be partially thick, the adverse effects of the operation of the parasitic transistor can be reduced.

In addition, by forming the film thickness of the gate insulating film formed on the bottom face of the trench to be thinner than that of the gate insulating film formed in the lower portions of the side faces of the trench, the following advantages can be acquired.

Figure 25:
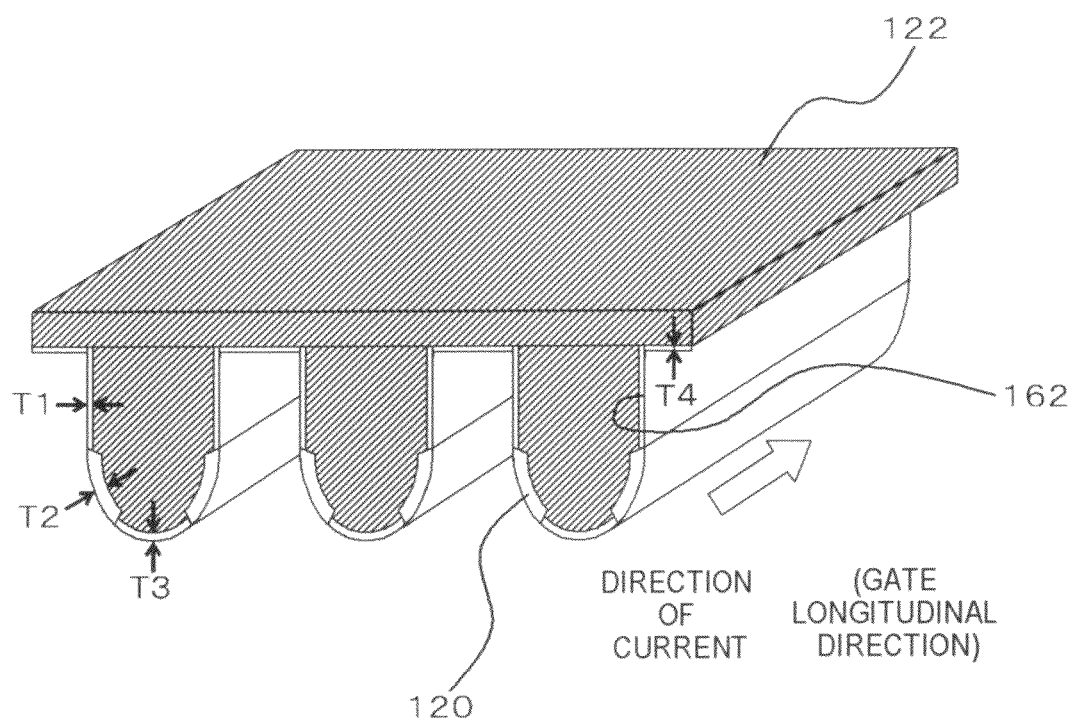
FIG. 25 is a diagram illustrating the advantages of a semiconductor device according to an embodiment of the present invention.

In the transistor of the semiconductor device 100 according to the second embodiment, as illustrated in FIG. 25, the trench 162 extends in the longitudinal direction of the gate that is a direction across which a current flows. Accordingly, by making the film thickness of the gate insulating film 120 located on the bottom face of the trench 162 thin being in the same level as that of the upper portions of the side faces of the trench, the bottom face portion of the trench 162, similarly to the upper portions of the side faces of the trench, can contribute to the operation of the transistor, whereby the driving capacity can be increased. In addition, by forming the film thickness T4 of the gate insulating film 120 formed on the surface of the substrate 102, the film thickness T1 of the gate insulating film 120 formed in the upper portions of the side faces of the trench, and the film thickness T3 of the gate insulating film 120 formed in the bottom face of the trench 162 to be thin, and by forming only the film thickness T2 of the gate insulating film 120 formed in the lower portions of the side faces of the trench, on which the electric field is concentrated, to be thick, the upper portions and the lower portions of the side faces of the trench gate can be operated as transistors having the same threshold voltage, and the operation at a low threshold voltage can be suppressed in the lower portions of the side faces.

Furthermore, by forming the film thickness of the gate insulating film 120 formed on the bottom face of the trench 162 thick to the extent of the same level as that of the gate insulating film 120 formed in the lower portions of the side faces of the trench, the film thickness of the gate insulating film 120 is thickened in a broad area from the lower portions of the side faces to the bottom face of the trench. In a case where such a configuration is employed, stress is concentrated on the lower portions of the trench, and accordingly, there is a possibility that inconvenience such as defection and leakage occurs. By forming the film thickness of the gate insulting film 120 formed on the bottom face of the trench 162 thin to the extent of the same level as that of the gate insulating film 120 formed in the upper portions of the side faces of the trench, an advantage of alleviating the concentration of stress on the lower portions can be acquired as well.

(Third Embodiment)

According to the embodiment, the shapes of a trench 162 and a gate insulating film 120, and the forming procedure thereof are different from those illustrated in the first and second embodiments.

Figure 26A:
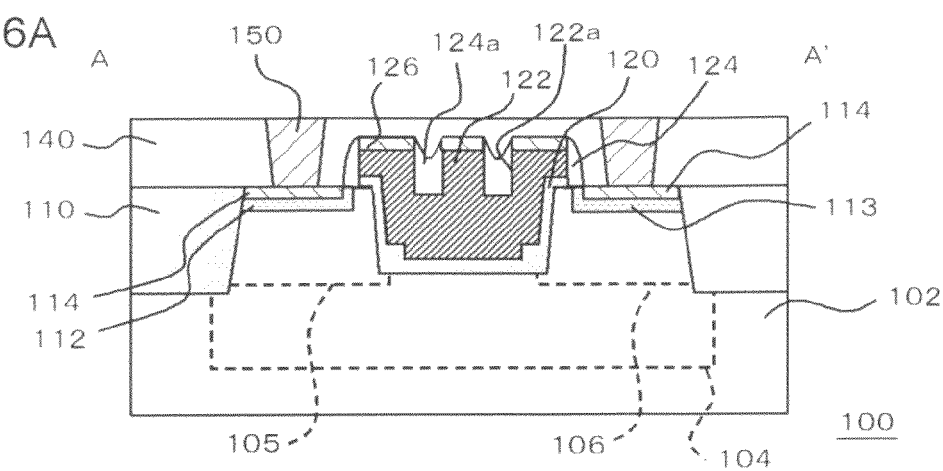
FIGS. 26A and 26B are cross-sectional views illustrating an example of the configuration of a semiconductor device according to an embodiment of the present invention.
Figure 26B:
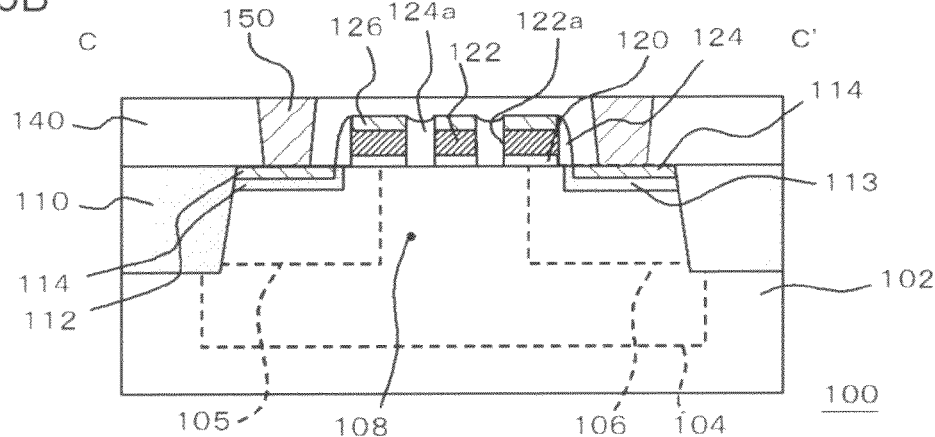
Figure 27A:
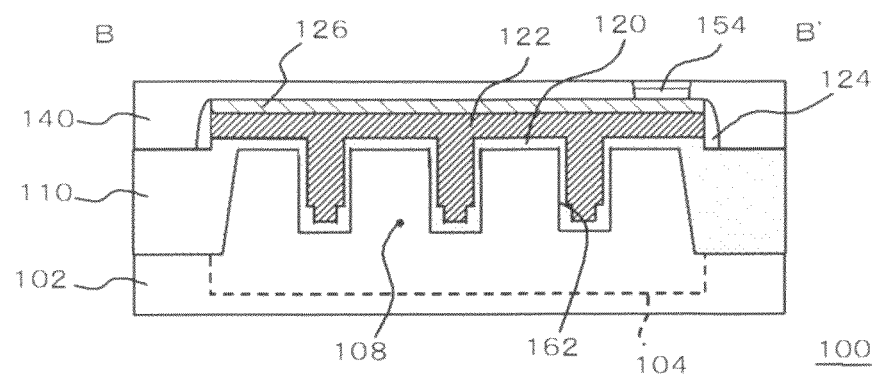
FIGS. 27A and 27B are cross-sectional views illustrating an example of the configuration of a semiconductor device according to an embodiment of the present invention.
Figure 27B:
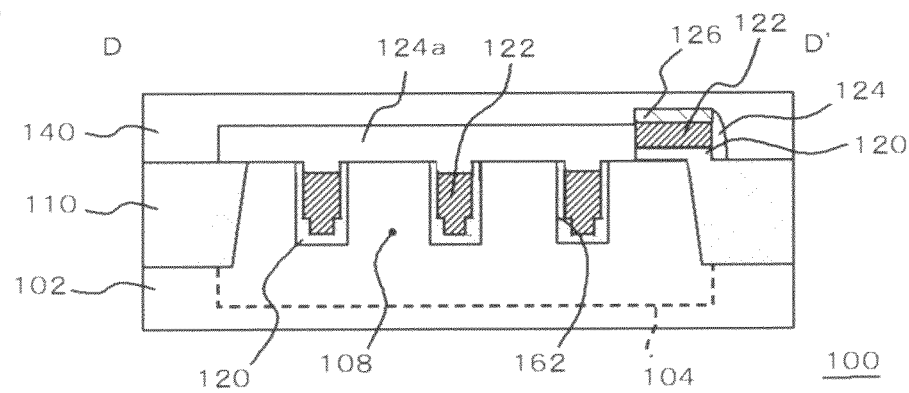

According to the embodiment, the planar structure of a semiconductor device 100 is the same as that illustrated in FIGS. 4A and 4B. FIGS. 26A to 27B are cross-sectional views illustrating the semiconductor device 100 according to the embodiment. FIG. 26A is a cross-sectional view taken along line A-A' shown in FIG. 4A, FIG. 26B is a cross-sectional view taken along line C-C' shown in FIG. 4A. In addition, FIG. 27A is a cross-sectional view taken along line B-B' shown in FIG. 4A, and FIG. 27B is a cross-sectional view taken along line D-D' shown in FIG. 4A.

Figure 28A:
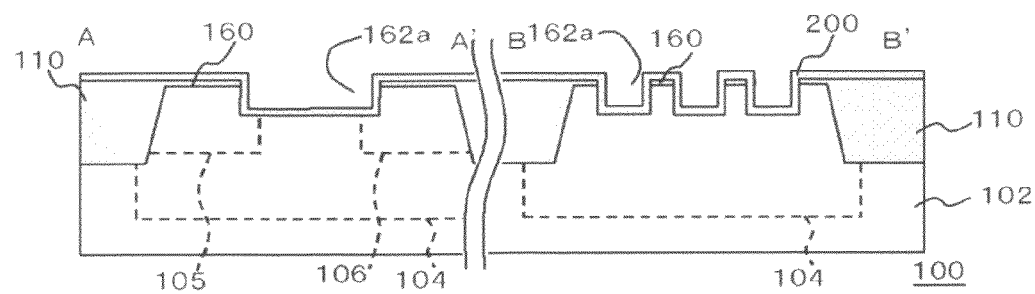
FIGS. 28A to 28C are process cross-sectional views illustrating an example of a manufacturing procedure of a semiconductor device according to an embodiment of the present invention.
Figure 28B:
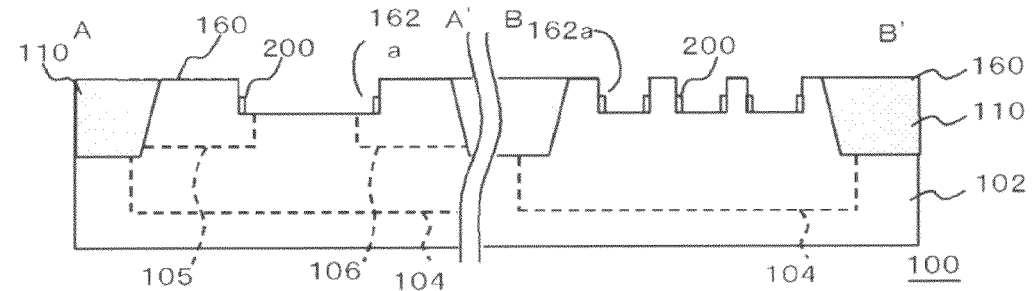
Figure 28C:
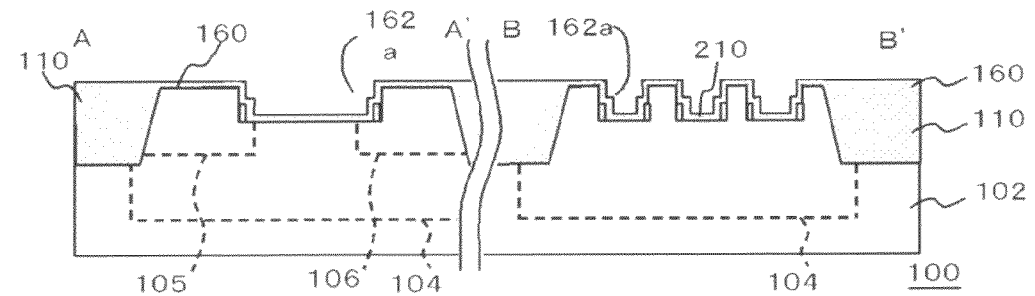

FIGS. 28A to 28C are process cross-sectional views illustrating an example of a manufacturing procedure of a semiconductor device 100 according to the embodiment. Here, diagrams corresponding to the cross-sections taken along lines A-A' and B-B' shown in FIG. 4A are illustrated. The procedure illustrated up to FIG. 22B can be performed similarly to that of the second embodiment.

Figure 22B:
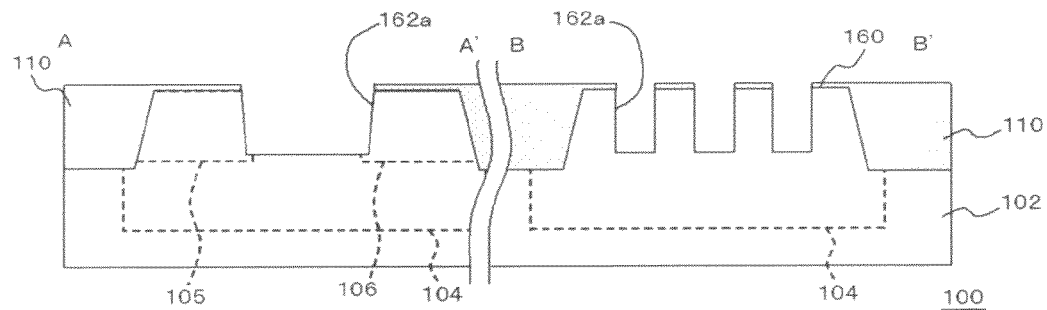
Figure 23A:
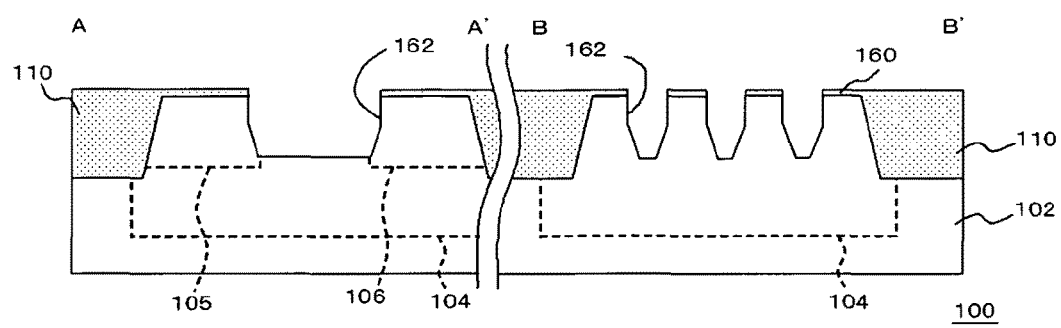
FIGS. 23A and 23B are process cross-sectional views illustrating an example of a manufacturing procedure of a semiconductor device according to an embodiment of the present invention.
Figure 23B:
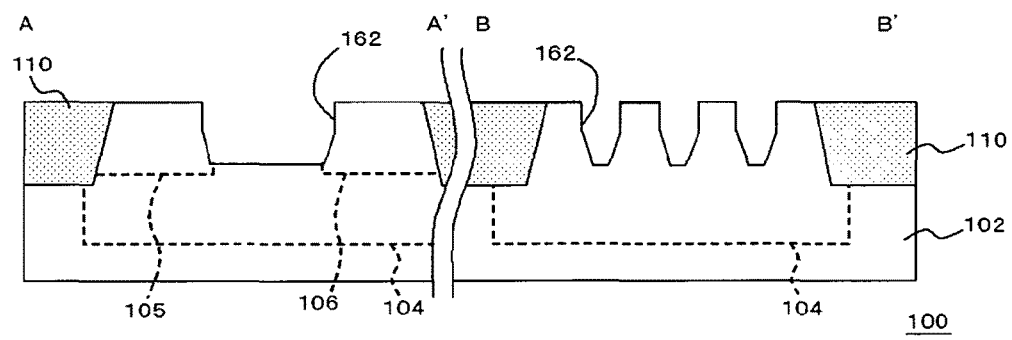

After the semiconductor device 100 having the configuration illustrated in FIG. 22B is formed, an oxide film 200 is formed on the entire face of the substrate 102 (FIG. 28A). The oxide film 200 can be formed, for example, through thermal oxidation or CVD. Thereafter, etch-back (anisotropic etching) is performed for the oxide film 200. At this time, by adjusting the etching conditions (etching time and the like), as illustrated in FIG. 28B, only the oxide film 200 that is formed in the lower portions of the side faces of the trench is allowed to remain. Thereafter, an oxide film 210 is formed on the entire surface of the substrate 102 for example through thermal oxidation or CVD (FIG. 28C). Here, since a thermal oxide film is further formed on the oxide film 200 in the lower portions of the side faces of the trench, the film thickness of the gate insulating film formed in the lower portions of the side faces of the trench is thicker than the film thickness of the gate insulating film 120 that is formed in the upper portions of the side faces of the trench, the bottom face of the trench 162, and on the surface of the substrate 102. In addition, the film thickness of the gate insulating film 120 formed on the bottom face of the trench 162 can be formed thin so as to be in the same level as that of the gate insulating film 120 formed in the upper portions of the side faces of the trench.

Thereafter, a conductive film to be a gate electrode 122 is formed on the entire upper face of the substrate 102 so as to allow the trench 162 to be buried therein. The subsequent processes thereof are the same as those which are subsequent to FIG. 8A described in the first embodiment.

Figure 29A:
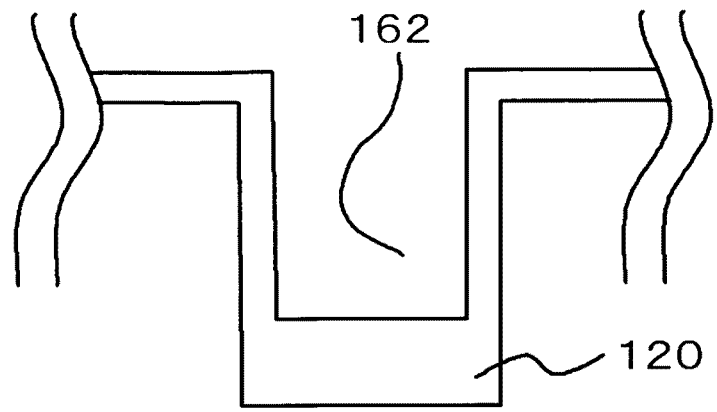
FIGS. 29A to 29C are cross-sectional views illustrating an example of the configuration of a semiconductor device according to an embodiment of the present invention.
Figure 29B:
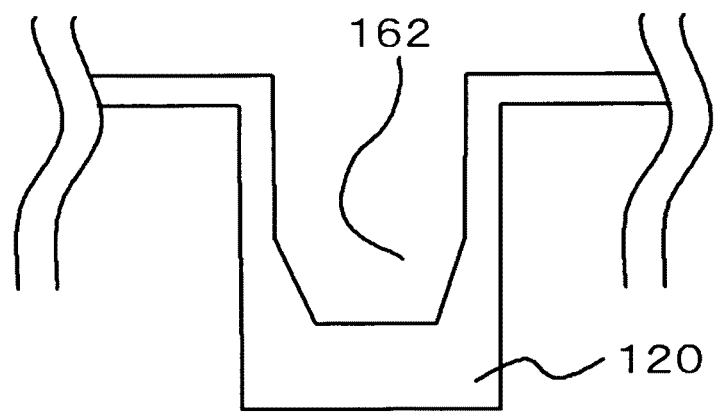
Figure 29C:
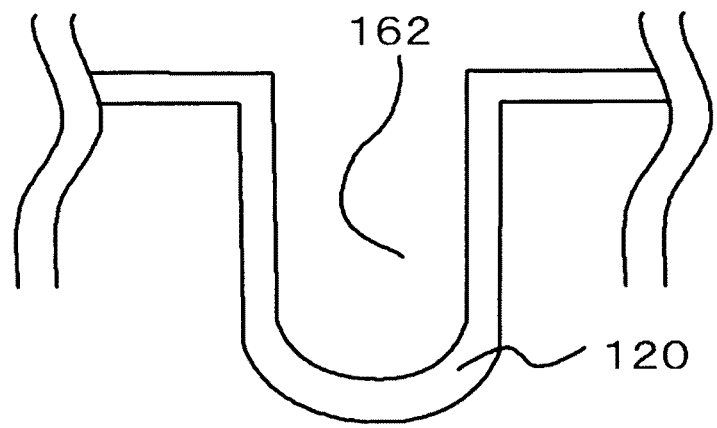

Here, FIGS. 29A to 29C illustrate other exemplary modifications of the trench 162 and the gate insulating film 120. In the diagrams, the cross-sectional states are illustrated. In FIG. 29A, a configuration is realized in which the film thickness of the gate insulating film 120 formed along the lower portions of the side faces of the trench is thicker than that of the gate insulating film 120 formed along the upper portions of the side faces of the trench by forming the gate insulating film 120 formed on the bottom face of the trench 162 to be thick. In a case where such a configuration is employed, as illustrated in FIG. 29B, the gate insulating film 120 may be formed thicker than that of other portions near the corner portion of the trench 162. FIG. 29C features the shape of the trench 162, and, to be more specific, the trench 162 is gently continuous from the side faces to the bottom face. In other words, the configuration illustrated in FIG. 29C does not have any corner portion made by the bottom face and the side faces, unlike the trenches 162 illustrated in FIGS. 29A and 29B. Such a modification can be implemented by combining an etching process and a deposition process.

According to the embodiment, the same operations and the advantages as those of the first and second embodiments can be realized.

As described above, although the embodiments of the present invention have been described with reference to the drawings, these are examples of the present invention, and various configurations other than the above-described embodiments can be employed.

Furthermore, although the description is not presented in the above-described embodiments, a channel stopper region having the same conductive type as that of the channel region 108 may be formed in both ends (in the direction of the width of the gate of the transistor) of the channel region 108 (the well 104).

It is apparent that the present invention is not limited to the above embodiment, and may be modified and changed without departing from the scope and spirit of the invention.

What is claimed is:

1. A semiconductor device comprising:
    a substrate that includes an element forming region that is partitioned by an element isolation insulating film; and
    a transistor that includes:
        a trench formed in said element forming region of said substrate;
        a gate insulating film formed on side faces and a bottom face of said trench;
        a gate electrode formed on said gate insulating film so as to bury said trench and on said substrate outside said trench so as to be exposed;
        a source region formed on one side of said gate electrode, which is disposed on a surface of said substrate, in a gate longitude direction; and
        a drain region formed on another side of said gate electrode in said gate longitude direction,
    wherein a longer direction of said trench is abreast of said gate longitude direction,
    wherein at least both ends of an edge of an opening of said trench in said gate longitude direction are covered with said exposed part of said gate electrode,
    wherein said gate electrode has at least one concave portion having a depth reaching a surface of said substrate,
    wherein said concave portion extends in a direction which intersects said gate longitude direction in a planar view,
    wherein said concave portion overlaps with a part of said trench, a part of said edge of said opening, and a part of said surface of said substrate located along said part of said edge in a planar view, and wherein said part of said edge and said part of said surface are not covered with said gate electrode.

2. The semiconductor device as set forth in claim 1, wherein said transistor further includes a plurality of trenches that are formed in said element forming region of said substrate and have depths intermittently changing in a gate width direction of said gate electrode, wherein said gate insulating film is formed on side faces and a bottom face of each of said plurality of trenches, wherein said gate electrode is formed on said gate insulating film so as to bury said plurality of trenches and is formed so as to be exposed on said substrate outside said plurality of trenches, and wherein said gate electrode formed so as to be exposed also on said substrate outside said plurality of trenches is disposed so as to cover upper portions of both ends of said plurality of trenches in said gate longitude direction and so as to form at least one concave portion having a depth reaching said substrate in a center portion.

3. The semiconductor device as set forth in claim 1, wherein said concave portion of said center portion of said gate electrode does not overlap said source region and said drain region.

4. The semiconductor device as set forth in claim 1, wherein a silicide block film is formed on said gate electrode and said concave portion, and wherein, in plan view, a region, in which said silicide block film is formed, is formed from one side of said concave portion to another side in said gate longitude direction and is formed from one boundary between said element isolation insulating film and said element forming region to another boundary in said gate width direction.

5. The semiconductor device as set forth in claim 1, wherein said gate electrode formed so as to be exposed is disposed so as to form a plurality of concave portions having a depth reaching said substrate in a center portion, wherein a silicide block film is formed on said gate electrode and said plurality of concave portions, and wherein, in plan view, a region, in which said silicide block film is formed, is formed from one side of said plurality of concave portions to the other side in said gate longitude direction, is continuously formed also on said gate electrode between said plurality of concave portions, and is formed from one boundary between said element isolation insulating film and said element forming region to the other boundary in said gate width direction.

6. The semiconductor device as set forth in claim 1, wherein said concave portion, in plan view, overlaps with at least a part of said side faces which is abreast of said gate longitude direction.

7. The semiconductor device as set forth in claim 1, wherein a part of said gate electrode buried in said trench which overlaps with said concave portion in plan view does not reach said surface of said substrate.

8. The semiconductor device as set forth in claim 1, wherein at least an area, in which said concave portion and said element forming region overlap each other in plan view of said substrate, is covered with a side wall insulating film.

9. The semiconductor device as set forth in claim 8, wherein a width of said concave portion in said gate longitude direction is less than twice a film thickness of said side wall insulating film formed on side faces of said gate electrode formed so as to be exposed on said substrate.

10. The semiconductor device as set forth in claim 1, wherein at least an area, in which said concave portion and said element forming region overlap each other in plan view of said substrate, is covered with a silicide block film.

11. The semiconductor device as set forth in claim 10, wherein an outer peripheral portion of said silicide block film, in plan view, is formed so as to overlap said gate electrode by 0.06 μm to 0.3 μm toward the outer periphery in said gate longitudinal direction and is formed so as to overlap said element isolation insulating film by 0.06 μm to 0.3 μm from one boundary between said element isolation insulating film and said element forming region and the other boundary toward said outer side in said gate width direction.

12. The semiconductor device as set forth in claim 1, wherein a surface of said gate electrode inside said trench, which is formed on a bottom face of said concave portion, is covered with a side wall insulating film.

13. The semiconductor device as set forth in claim 12, wherein a groove width of a groove that is formed by said trench and said gate insulating film in a gate width direction is less than twice a side-face film thickness of said side wall insulating film formed on side faces of said gate electrode formed so as to be exposed on said substrate.

14. The semiconductor device as set forth in claim 13, wherein, when said side-face film thickness of said side wall insulating film formed on said side faces of said gate electrode formed so as to be exposed on said substrate is $G_{rx}$, an upper-face film thickness of said side wall insulating film formed on an upper face of said gate electrode formed so as to be exposed on said substrate is $G_{ry}$, said groove width of said groove formed by said trench and said gate insulating film in said gate width direction is S, and a distance from said surface of said gate electrode inside said trench formed on said bottom face of said concave portion to a surface of said substrate is $D_{epth}$, a relational equation of "$D_{epth} > G_{ry} - \sqrt{(G_{ry}^2 - (S/2 \times G_{ry}/G_{rx})^2)}$" is satified.

15. The semiconductor device as set forth in claim 13, wherein, when said side-face film thickness of said side wall insulating film formed on said side faces of said gate electrode formed so as to be exposed on said substrate is Tsw, said groove width of said groove follned by said trench and said gate insulating film in said gate width direction is S, and a distance from said surface of said gate electrode inside said trench formed on said bottom face of said concave portion to a surface of said substrate is $D_{epth}$, a relational equation of "$D_{epth} > T_{sw} - \sqrt{(T_{sw}^2 - (S/2)^2)}$" is satified.

16. A semiconductor device comprising:

a substrate that includes an element forming region that is partitioned by an element isolation insulating film; and a transistor that includes:

a trench formed in said element forming region of said substrate;

a gate insulating film formed on side faces and a bottom face of said trench;

a gate electrode formed on said gate insulating film so as to bury said trench and on said substrate outside said trench so as to be exposed;

a source region formed on one side of said gate electrode, which is disposed on a surface of said substrate, in a gate longitude direction; and a drain region founed on the other side of said gate electrode in said gate longitude direction, wherein a longer direction of said trench is abreast of said gate longitude direction, wherein at least both ends of an edge of an opening of said trench in said gate longitude direction are covered with said exposed part of said gate electrode, wherein said gate electrode has at least one concave portion having a depth reaching a surface of said substrate,
wherein said concave portion extends in a direction which intersects said gate longitude direction in a planar view,
wherein said concave portion overlaps with a part of said trench, a part of said edge of said opening, and a part of said surface of said substrate located along said part of said edge in a planar view, and
wherein said part of said edge and said part of said surface are not covered with said gate electrode,
and
wherein a film thickness of said gate insulating film formed in lower portions from a predetermined height of said side faces of said trench is thicker than a film thickness of said gate insulating film formed along upper portions from said predetermined height of said side faces of said trench and is equal to or more than a film thickness of said gate insulating film on said bottom face.

17. The semiconductor device as set forth in claim 16, wherein said transistor includes a plurality of trenches that are formed in said element forming region of said substrate and have depths intermittently changing in a gate width direction of said gate electrode,
wherein said gate insulating film is formed on side faces and a bottom face of each of said plurality of trenches,
wherein said gate electrode is formed on said gate insulating film so as to bury said plurality of trenches and is formed so as to be exposed on said substrate outside said plurality of trenches,
wherein said gate electrode formed so as to be exposed also on said substrate outside said plurality of trenches is disposed so as to cover upper portions of both ends of said plurality of trenches in said gate longitude direction and so as to form at least one concave portion having a depth reaching said substrate in a center portion, and
wherein a film thickness of said gate insulating film formed in lower portions from a predetermined height of said side faces of said trench is thicker than a film thickness of said gate insulating film formed along said upper portions from said predetermined height of said side faces of said trench and is greater than or equal to a film thickness of said gate insulating film on said bottom face.

18. The semiconductor device as set forth in claim 1, wherein an insulating film is formed on side faces of the concave portion and the semiconductor substrate having been reached at the center portion of the concave portion.

19. The semiconductor device as set forth in claim 16, wherein said concave portion, in plan view, overlaps with at least a part of said side faces which is abreast of said gate longitude direction.

20. The semiconductor device as set forth in claim 16, wherein a part of said gate electrode buried in said trench which overlaps with said concave portion in plan view does not reach said surface of said substrate.

21. A device comprising:
a substrate including a trench having a first upper side and a second upper side; and
a transistor that includes:
 a gate electrode that includes:
  a first portion formed in the trench; and
  a second portion that is formed outside of the trench, the second portion including a first side and a second side, the first side and the second side covering the first upper side and the second upper side of the trench, respectively;
 a source region formed adjacent to the first side of the second portion of the gate electrode; and
 a drain region formed adjacent to the second side of the second portion of the gate electrode,
wherein at least one portion of the second portion of the gate electrode is discontinuous in a channel region,
wherein at least both ends of an edge of an opening of said trench in a gate longitude direction are covered with said second portion of said gate electrode,
wherein said gate electrode has at least one concave portion having a depth reaching a surface of said substrate,
wherein said concave portion extends in a direction which intersects said gate longitude direction in a planar view,
wherein said concave portion overlaps with a part of said trench, a part of said edge of said opening, and a part of said surface of said substrate located along said part of said edge in a planar view, and
wherein said part of said edge and said part of said surface are not covered with said gate electrode.

22. The device as set forth in claim 21, wherein the at least one portion of the second portion of the gate electrode that is discontinuous has a depth that reaches the substrate.

23. The device as set forth in claim 21, wherein said transistor includes a plurality of trenches that are formed in said element forming region of said substrate and have depths intermittently changing in a gate width direction of said gate electrode,
wherein said gate insulating film is formed on side faces and a bottom face of each of said plurality of trenches,
wherein said gate electrode is formed on said gate insulating film so as to bury said plurality of trenches and is formed so as to be exposed on said substrate outside said plurality of trenches.

24. A semiconductor device comprising:
a substrate that includes an element forming region that is partitioned by an element isolation insulating film; and
a transistor that includes:
 a trench formed in said element forming region of said substrate;
 a gate insulating film formed on side faces and a bottom face of said trench;
 a gate electrode formed on said gate insulating film so as to bury said trench;
 a source region formed on one side of said gate electrode, which is disposed on a surface of said substrate, in a gate longitude direction;
 a drain region formed on another side of said gate electrode in said gate longitude direction; and
 a channel region formed between said source region and said drain region in said gate longitude direction,
wherein said channel region extends in a first direction intersecting said gate longitude direction in a planar view,
wherein a depth direction of side faces of said trench, formed between said source region and said drain region, being parallel with said gate longitude direction, is a width direction of said gate,
wherein said gate insulating film is formed on said side faces and said bottom face of said trench,
wherein said gate electrode is formed on said gate insulating film so as to bury said trench, and
wherein said gate electrode includes a portion between said source region and said drain region in said gate longitude direction which does not reach a surface of said substrate.

25. The semiconductor device as set forth in claim 24, wherein said transistor includes a plurality of trenches that are formed in said element forming region of said substrate,
- wherein said gate insulating film is formed on said side faces and said bottom face of said plurality of trenches, and
- wherein said gate electrode is formed on said gate insulating film so as to bury said plurality of trenches.

26. The semiconductor device as set forth in claim 24, wherein said gate electrode is formed also on said substrate outside said trench so as to be exposed, and
- wherein said gate electrode fowled so as to be exposed is disposed so as to cover upper portions of both ends of said trench in said gate longitude direction.

27. The semiconductor device as set forth in claim 24, wherein a film thickness of said gate insulating film fowled along lower portions from said portion of said gate electrode which does not reach said surface of said substrate is thicker than a film thickness of said gate insulating film formed along upper portions from said portion of said gate electrode which does not reach said surface of said substrate and is greater than or equal to a film thickness of said gate insulating film on said bottom face.

28. The semiconductor device as set forth in claim 27, wherein said gate electrode is formed so as to be exposed also on said substrate outside said plurality of trenches, and said gate electrode formed so as to be exposed is disposed so as to cover upper portions of both ends of said plurality of trenches in said gate longitude direction.

\* \* \* \* \*